US010515939B2

(12) United States Patent
Chen et al.

(10) Patent No.: US 10,515,939 B2
(45) Date of Patent: Dec. 24, 2019

(54) WAFER-LEVEL PACKAGE HAVING MULTIPLE DIES ARRANGED IN SIDE-BY-SIDE FASHION AND ASSOCIATED YIELD IMPROVEMENT METHOD

(71) Applicant: MEDIATEK INC., Hsinchu (TW)

(72) Inventors: Yi-Hung Chen, Yilan County (TW); Yuan-Chin Liu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 15/015,110

(22) Filed: Feb. 3, 2016

(65) Prior Publication Data

US 2016/0240497 A1    Aug. 18, 2016

Related U.S. Application Data

(60) Provisional application No. 62/117,091, filed on Feb. 17, 2015, provisional application No. 62/130,807, filed on Mar. 10, 2015, provisional application No. 62/198,152, filed on Jul. 29, 2015.

(51) Int. Cl.
*H01L 23/48* (2006.01)
*H01L 25/00* (2006.01)
(Continued)

(52) U.S. Cl.
CPC .......... *H01L 25/50* (2013.01); *H01L 23/5384* (2013.01); *H01L 25/0655* (2013.01);
(Continued)

(58) Field of Classification Search
CPC ... H01L 23/5384; H01L 23/538; H01L 50/50; H01L 50/0655; H01L 24/00; H01L 24/02
See application file for complete search history.

(56) References Cited

U.S. PATENT DOCUMENTS 8,432,027 B2    4/2013    Foster, Sr.
9,350,339 B2    5/2016    Bryan et al.
(Continued)

FOREIGN PATENT DOCUMENTS

CN    102931094 A    2/2013

OTHER PUBLICATIONS

Yu-Hung Chen et al., Title: Wafter-Level Package Having Asynchronous FIFO Buffer Used to Deal With Data Transfer Between Different Dies and Associated Method, pending U.S. Appl. No. 15/015,145, filed Feb. 4, 2016.

(Continued)

*Primary Examiner* — Hoa B Trinh
(74) *Attorney, Agent, or Firm* — Oblon, McClelland, Maier & Neustadt, L.L.P.

(57) ABSTRACT

A wafer-level package includes a plurality of dies and a plurality of connection paths. The dies include at least a first die and a second die. The dies are arranged in a side-by-side fashion, and a first side of the first die is adjacent to a first side of the second die. The connection paths connect input/output (I/O) pads arranged on the first side of the first die to I/O pads arranged on the first side of the second die, wherein adjacent I/O pads on the first side of the first die are connected to adjacent I/O pads on the first side of the second die via connection paths on only a single layer. For example, the first die is identical to the second die. For another example, the wafer-level package is an integrated fan-out (InFO) package or a chip on wafer on substrate (CoWoS) package. For yet another example, the dies are assembled in the wafer-level package to perform a network switch function.

6 Claims, 21 Drawing Sheets

US 10,515,939 B2

Page 2

(51) Int. Cl.
*H01L 25/065* (2006.01)
*H01L 23/538* (2006.01)

(52) U.S. Cl.
CPC .... *H01L 23/538* (2013.01); *H01L 2224/0401* (2013.01); *H01L 2224/16227* (2013.01); *H01L 2924/15192* (2013.01); *H01L 2924/15311* (2013.01)

(56) References Cited

U.S. PATENT DOCUMENTS

| | | |
|---|---|---|
| 2008/0272368 A1 | 11/2008 | Do |
| 2012/0267800 A1 | 10/2012 | Lin et al. |
| 2013/0326205 A1 | 12/2013 | Kulick et al. |
| 2014/0312475 A1 | 10/2014 | Ali |
| 2014/0332966 A1* | 11/2014 | Xiu .............. H01L 23/293 257/773 |
| 2015/0206867 A1* | 7/2015 | Lim .............. H01L 25/18 257/676 |
| 2015/0333046 A1* | 11/2015 | Makihata .......... H01L 25/18 257/773 |

OTHER PUBLICATIONS

Chinese Office Action issued in Chinese Patent Application No. 201610087246.6 dated Dec. 25, 2017.
Office Action dated Aug. 1, 2018, in U.S. Appl. No. 16/018,085.
Office Action dated Mar. 13, 2019 in European Patent Application No. 16 155 928.1, 5 pages.

* cited by examiner (A)

(B)

(A)

(B)

WAFER-LEVEL PACKAGE HAVING MULTIPLE DIES ARRANGED IN SIDE-BY-SIDE FASHION AND ASSOCIATED YIELD IMPROVEMENT METHOD

CROSS REFERENCE TO RELATED APPLICATIONS

This application claims the benefit of U.S. provisional application No. 62/117,091 (filed on Feb. 17, 2015), U.S. provisional application No. 62/130,807 (filed on Mar. 10, 2015), and U.S. provisional application No. 62/198,152 (filed on Jul. 29, 2015). The entire contents of the related application are incorporated herein by reference.

BACKGROUND

The present invention relates to design and fabrication of a chip, and more particularly, to a wafer-level package having multiple dies arranged in a side-by-side fashion and an associated yield improvement method.

When a chip function of a target chip is achieved using a large-sized die, the fabrication of large-sized dies on a wafer will suffer from low yield and high cost. For example, assuming that distribution of defects on a wafer is the same, a die yield of large-sized dies fabricated on the wafer is lower than a die yield of small-sized dies fabricated on the same wafer. In other words, the die yield loss is positively correlated with the die size. If the network switch chips are fabricated using large-sized dies, the production cost of the network switch chips is high due to the high die yield loss. Thus, there is a need for an innovative integrated circuit design which is capable of reducing the yield loss as well as the production cost.

SUMMARY

One of the objectives of the claimed invention is to provide a wafer-level package having multiple dies arranged in a side-by-side fashion and a related yield improvement method.

According to a first aspect of the present invention, an exemplary wafer-level package is disclosed. The exemplary wafer-level package includes a plurality of dies and a plurality of connection paths. The dies include at least a first die and a second die, wherein the dies are arranged in a side-by-side fashion, and a first side of the first die is adjacent to a first side of the second die. The connection paths are configured to connect input/output (I/O) pads arranged on the first side of the first die to I/O pads arranged on the first side of the second die, wherein adjacent I/O pads on the first side of the first die are connected to adjacent I/O pads on the first side of the second die via connection paths on only a single layer.

According to a second aspect of the present invention, an exemplary wafer-level package is disclosed. The exemplary wafer-level package includes a plurality of dies and a plurality of connection paths. The dies include at least a first die, a second die, and a third die, wherein the dies are arranged in a side-by-side fashion, the first die is identical to the second die, and the third die is distinct from each of the first die and the second die. The connection paths are configured to connect input/output (I/O) pads arranged on a first side of the first die to I/O pads arranged on a first side of the third die, and configured to connect I/O pads arranged on a first side of the second die to I/O pads arranged on a second side of the third die, wherein each of the first side of the first die and the first side of the second die is a same side of an identical die.

According to a third aspect of the present invention, an exemplary yield improvement method is disclosed. The exemplary yield improvement method includes: providing a plurality of first candidate dies each having a same first circuit module design, wherein a chip function of a target chip is split into at least first circuit designs each having the same first circuit module design; selecting a plurality of first good dies from the first candidate dies; and generating the target chip by assembling at least the selected first good dies in a wafer-level package.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
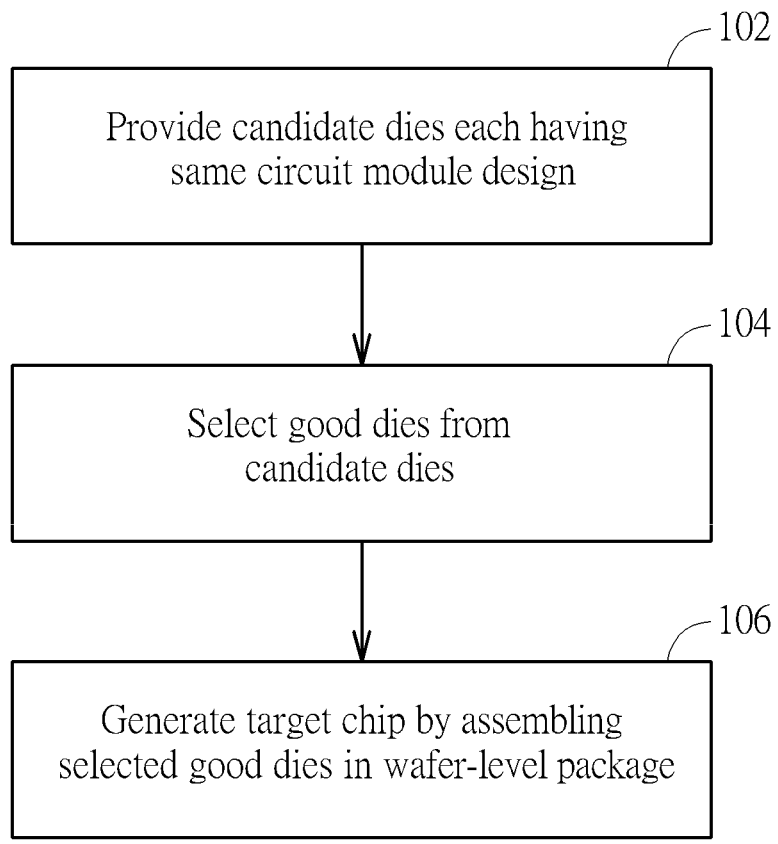
FIG. 1 is a flowchart illustrating a first yield improvement method according to an embodiment of the present invention.

FIG. 1 is a flowchart illustrating a first yield improvement method according to an embodiment of the present invention. Provided that the result is substantially the same, the steps are not required to be executed in the exact order shown in FIG. 1. In addition, certain steps may be added to or removed from the flow shown in FIG. 1. The exemplary yield improvement method may be briefly summarized as below.

Step 102: Provide a plurality of candidate dies each having the same circuit module design. For example, a chip function of a target chip is split into a plurality of circuit designs each having the same circuit module design.

Step 104: Select a plurality of good dies from the candidate dies.

Step 106: Generate the target chip by assembling the selected good dies in the same wafer-level package.

Byway of example, but not limitation, all of the steps 102-106 may be performed in the same semiconductor foundry. Given the same die area, the yield of one large die is lower than the yield of multiple small dies. Splitting one large die to multiple smaller dies may bring some overhead. There is a need to minimize the overhead. Hence, the present proposes an innovative manner to split a chip (e.g., a switch chip). For example, assuming that distribution of defects on a wafer is the same, a die yield of one large-sized dies fabricated on the wafer is lower than a die yield of multiple small-sized dies which have the same area fabricated on the same wafer. Since the fabrication of large-sized dies on a wafer suffers from low yield and high cost, the present invention therefore proposes determining a circuit module design such that a chip function of a target chip can be split into a plurality of circuit designs each having the same circuit module design, and fabricating a plurality of smaller-sized dies, each having the same circuit module design, on a wafer.

Figure 2:
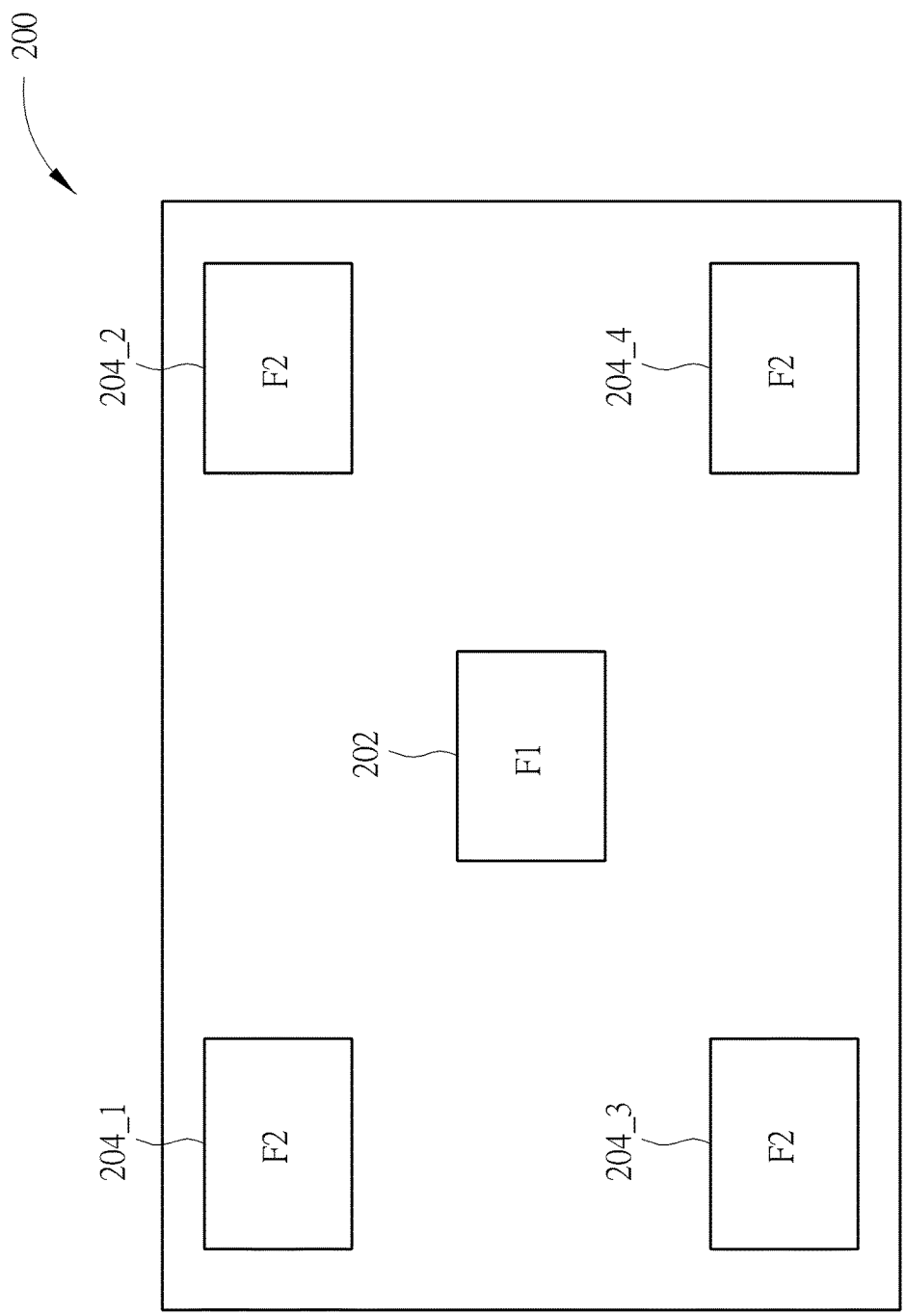
FIG. 2 is a diagram illustrating an example of a target chip fabricated using a large-sized die.
Figure 3:
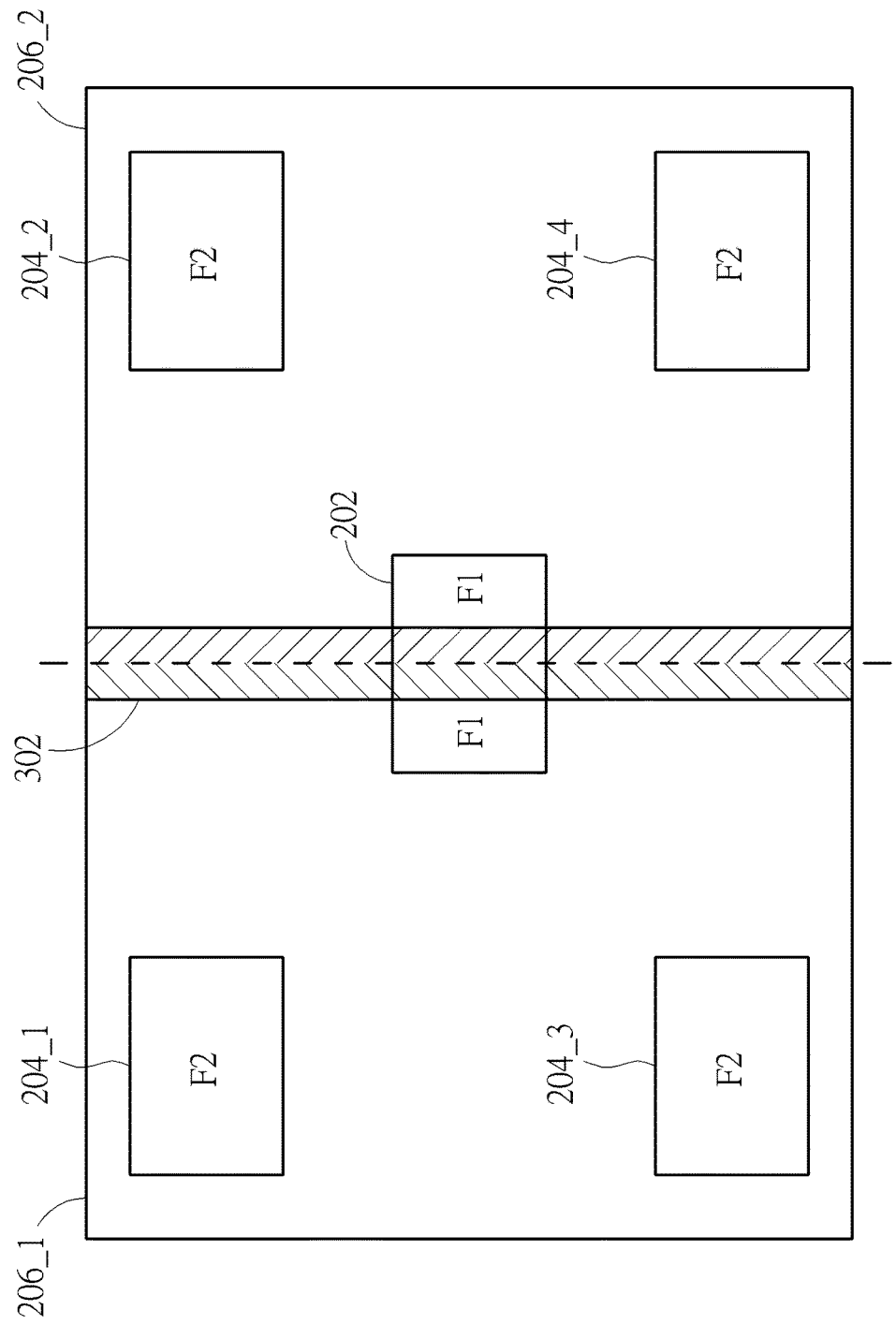
FIG. 3 is a diagram illustrating an example of splitting a chip function of a target chip into two circuit designs each having the same circuit module design.

Please refer to FIG. 2 in conjunction with FIG. 3. FIG. 2 is a diagram illustrating an example of a target chip fabricated using a large-sized die. FIG. 3 is a diagram illustrating an example of splitting a chip function of a target chip into two circuit designs each having the same circuit module design. In this example, one target chip (e.g., a network switch chip) 200 is designed to support a chip function (e.g., a network switch function) realized using a plurality of functional blocks 202 and 204_1-204_4, where the functional blocks 204_1-204_4 have the same function F2, and the functional block 202 has a function F1 distinct from the function F2. For example, the functional block 202 may include a traffic manager (TM) of a multi-plane network switch, and each of the functional blocks 204_1-204_4 may include ingress packet processing circuits and egress packet processing circuits of one plane.

Wafer-level packaging is the technology of packaging semiconductor dies, which is different from a typical packaging method of slicing a wafer into individual semiconductor dies and then packaging the individual semiconductor dies. The wafer-level package mentioned above is therefore fabricated based on wafer-level process. That is, multiple semiconductor dies (e.g., homogeneous dies or heterogeneous dies) assembled in the same wafer-level package and connection paths/transmission buses/communication channels and so on routed between the semiconductor dies are fabricated with wafer-level process. Hence, connection paths, communication buses, or communication channels could be implemented by metal layer (such as RDL metal layer, Re-Distribution Layer, a metal layer on a die that makes the I/O pads of an integrated circuit available in other locations) rather than bonding wire of typical package.

The wafer-level package may be an integrated fan-out (InFO) package or a chip on wafer on substrate (CoWoS) package. Take InFO packages as examples for the following wafer-level packages, but not for a limitation. The wafer-level package used for the proposed ideas may be an InFO package or a CoWoS package, "InFO package" and "CoWoS package" may be interchangeable.

As shown in FIG. 3, the chip function of the target chip 200 is evenly split into two circuit designs 206_1 and 206_2 each having the same circuit module design. In this embodiment, a circuit module design is designed to have one functional block with the function F1 and two function blocks with the same function F2, and is further designed to have an extra input/output (I/O) function 302 due to partition overhead needed for reconstructing a target chip with a desired chip function in a wafer-level package. If the circuit design 206_2 is rotated by 180 degrees, the circuit design 206_2 exactly matches the circuit design 206_1 due to that fact both of the circuit designs 206_1 and 206_2 have the same circuit module design. Since the chip function of the target chip 200 is evenly split into two identical dies, none of the function blocks in each identical die is treated as a redundant block after two identical dies are assembled in the same wafer-level package to generate the target chip 200.

According to a circuit module design configured by splitting a chip function of a target chip, identical smaller-sized dies, each having the same circuit module design, can be fabricated on a wafer (Step 102). Compared to a die yield of larger-sized dies each having the chip function of the chip 200 and fabricated on a wafer, a die yield of smaller-sized dies each having the circuit module design and fabricated on the same wafer is higher due to reduced yield loss. Moreover, since a single mask of the circuit module design can be used to fabricate a plurality of identical dies, the mask cost can be saved greatly.

Since the desired chip function is split into multiple circuit designs each having the same circuit module design and each identical die is fabricated using the same circuit module design, multiple dies can be assembled to reconstruct the target chip with the desired chip function. In step 104, multiple good dies are selected from the candidate dies fabricated on a wafer, where the number of selected good dies depends on the number of identical circuit module designs needed to reconstruct the desired chip function. In step 106, the selected good dies are assembled in a wafer-level package to generate a target chip with the desired chip function. For example, the wafer-level package may be an integrated fan-out (InFO) package or a chip on wafer on substrate (CoWoS) package. With regard to assembling homogeneous dies in one wafer-level package, several exemplary assembly designs are provided as below.

Figure 4:
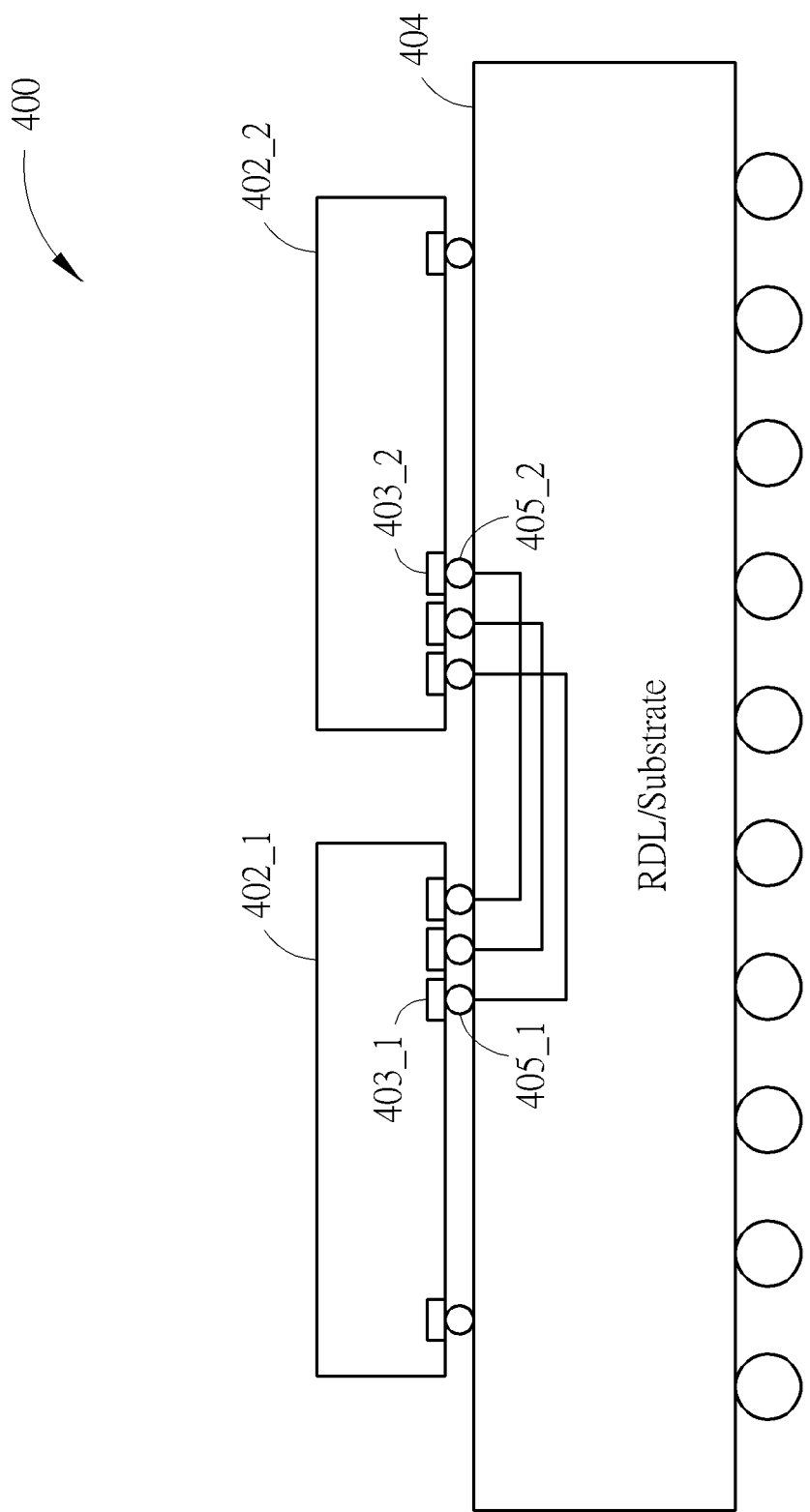
FIG. 4 is a section view of a wafer-level package according to an embodiment of the present invention.

FIG. 4 is a section view of a wafer-level package according to an embodiment of the present invention. In this example, two dies 402_1 and 402_2 (e.g., identical dies) are assembled in the same wafer-level package 400. The dies 402_1 and 402_2 are arranged on a wafer-level package in a side-by-side fashion. That is, the dies 402_1 and 402_2 are not vertically stacked. The die 402_1 has a plurality of input/output (I/O) pads 403_1, and is mounted on a redistribution layer (RDL) or substrate 404 via bumps 405_1. Similarly, the die 402_2 has a plurality of I/O pads 403_2, and is mounted on the RDL/substrate 404 via bumps 405_2. Further, the dies 402_1 and 402_2 can be connected by connection paths routed in the RDL/substrate 404. For example, in a case where the InFO packaging technology is employed, the connection paths are implemented using InFO wires (e.g., Cu post passivation interconnections) that may act as the RDL routing. It should be noted that the package structure shown in FIG. 4 is for illustrative purposes only, and is not meant to be a limitation of the present invention.

Figure 5:
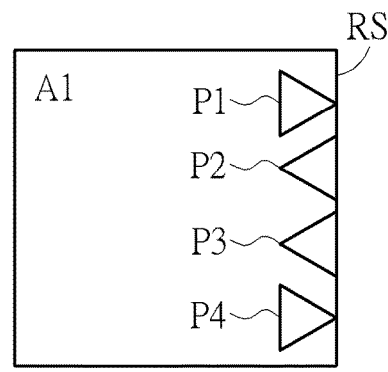
FIG. 5 is a diagram illustrating a first assembly design of homogeneous dies according to an embodiment of the present invention.
Figure 5:
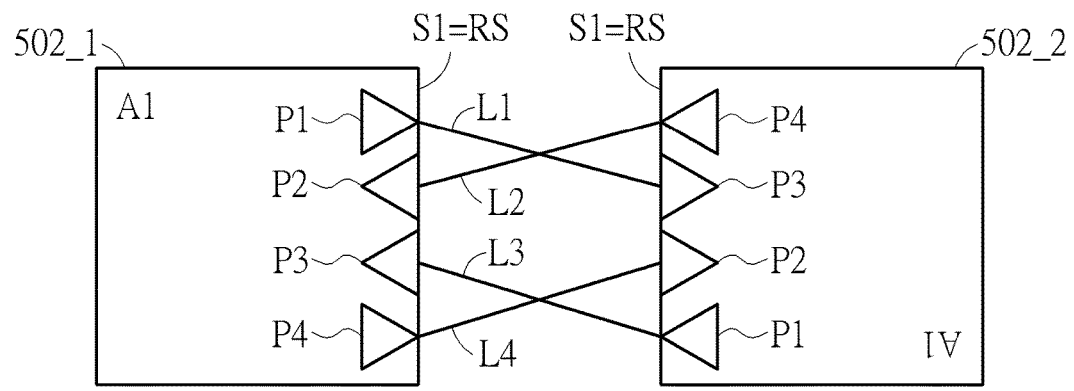

FIG. 5 is a diagram illustrating a first assembly design of homogeneous dies according to an embodiment of the present invention. The sub-diagram (A) of FIG. 5 illustrates a single die A1 having a plurality of I/O pads P1, P2, P3, P4 on the right side RS. The I/O pads P1-P4 are unidirectional, where the I/O pads P1 and P4 are output pads for transmitting output signals generated from output buffers (not shown) in the die A1, and I/O pads P2 and P3 are input pads for receiving input signals to be processed by input buffers (not shown) in the die A1. The sub-diagram (B) of FIG. 5 illustrates two identical dies 502_1 and 502_2 connected using RDL/substrate routing. The dies 502_1 and 502_2 may be a master-slave pair or a peer-to-peer pair. The single die A1 shown in sub-diagram (A) of FIG. 5 may be fabricated according a circuit module design mentioned above. Hence, each of the dies 502_1 and 502_2 is identical to the single die A1. The dies 502_1 and 502_2 are arranged on a wafer-level package in a side-by-side fashion. In addition, a first side S1 of the die 502_1 is adjacent to a first side S1 of the die 502_2, where each of the first side S1 of the die 502_1 and the first side S1 of the die 502_2 is the same side of an identical die (i.e., right side RS of single die A1). Hence, the orientation of the die 502_2 has a 180-degree rotation with respect to the orientation of the die 502_1. As mentioned above, the I/O pads P1 and P4 are output pads, and the I/O pads P2 and P3 are input pads. In this example, the I/O pad P1 of the die 502_1 is connected to the I/O pad P3 of the die 502_2 via a connection path L1, the I/O pad P2 of the die 502_1 is connected to the I/O pad P4 of the die 502_2 via a connection path L2, the I/O pad P3 of the die 502_1 is connected to the I/O pad P1 of the die 502_2 via a connection path L3, and the I/O pad P4 of the die 502_1 is connected to the I/O pad P2 of the die 502_2 via a connection path L4. The connection paths between the dies 502_1 and 502_2 have crossing connection paths L1-L4 routed on different layers, which increases the design complexity of the RDL/substrate routing. The present invention further proposes an innovative I/O design/arrangement for avoiding crossing connection paths between identical dies assembled in a wafer-level package.

Figure 6:
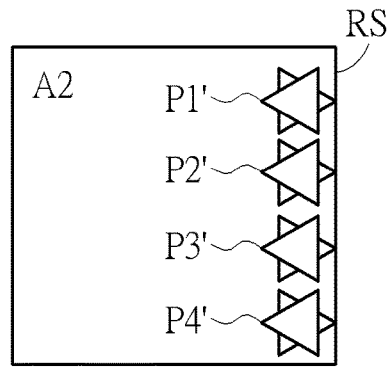
FIG. 6 is a diagram illustrating a second assembly design of homogeneous dies according to an embodiment of the present invention.
Figure 6:
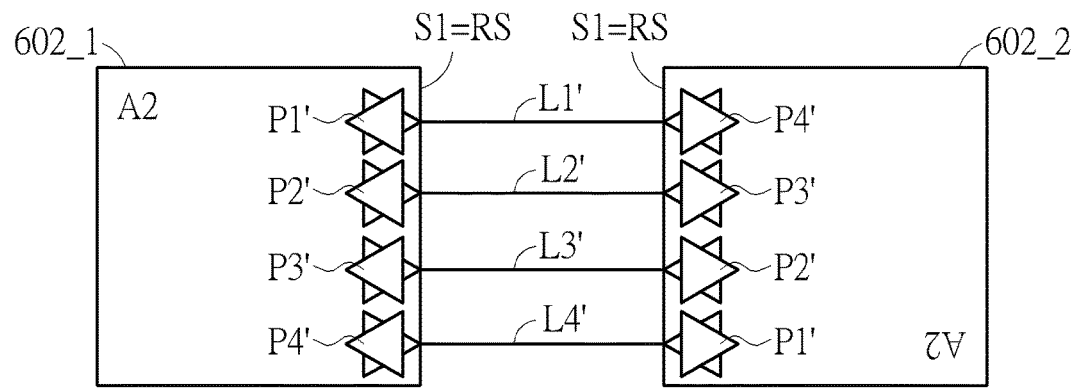

FIG. 6 is a diagram illustrating a second assembly design of homogeneous dies according to an embodiment of the present invention. The sub-diagram (A) of FIG. 6 illustrates a single die A2 having a plurality of I/O pads P1', P2', P3', P4' on the right side RS. The I/O pads P1'-P4' are bidirectional. Hence, each of the I/O pads P1'-P4' can be configured to act as either an input pad (which is used for receiving an input signal to be processed by an input buffer (not shown) in the die A2) or an output pad (which is used for transmitting an output signal generated from an output buffer (not shown) in the die A2). The sub-diagram (B) of FIG. 6 illustrates two identical dies 602_1 and 602_2 connected using direct connection paths L1', L2', L3', L4'. The dies 602_1 and 602_2 may be a master-slave pair or a peer-to-peer pair. The single die A2 shown in sub-diagram (A) of FIG. 6 may be fabricated according a circuit module design mentioned above. Hence, each of the dies 602_1 and 602_2 is identical to the single die A2. The dies 602_1 and 602_2 are arranged on a wafer-level package in a side-by-side fashion. In addition, a first side S1 of the die 602_1 is adjacent to a first side S1 of the die 602_2, where each of the first side S1 of the die 602_1 and the first side S1 of the die 602_2 is the same side of an identical die (i.e., right side RS of single die A2). Hence, the orientation of the die 602_2 has a 180-degree rotation with respect to the orientation of the die 602_1. Since the I/O pads P1'-P4' are bidirectional, the I/O pad P1' of the die 602_1 is connected to the I/O pad P4' of the die 602_2 via a direct connection path L1', the I/O pad P2' of the die 602_1 is connected to the I/O pad P3' of the die 602_2 via a direct connection path L2', the I/O pad P3' of the die 602_1 is connected to the I/O pad P2' of the die 602_2 via a direct connection path L3', and the I/O pad P4' of the die 602_1 is connected to the I/O pad P1' of the die 602_2 via a direct connection path L4'. With the use of a bidirectional I/O design, adjacent I/O pads on the first side S1 of the die 602_1 are connected to adjacent I/O pads on the first side S1 of the die 602_2 via connection paths on only a single layer. For example, the connection paths between the dies 602_1 and 602_2 have no crossing connection paths routed via different layers, which can simplify the RDL/substrate routing greatly. It is noted that the I/O pads or the connection paths operate functionally, which are not dummy ones.

The assembly example shown in FIG. 6 has only two identical dies each using a bidirectional I/O design. However, this is for illustrative purposes only, and is not meant to be a limitation of the present invention. Assembling more than two identical dies each using a bidirectional I/O design in a wafer-level package is feasible. Hence, different products (e.g., network switch products with different line rates) can be provided by assembling different numbers of homogeneous dies. In addition, the same objective of connecting adjacent I/O pads on one side of one die to adjacent I/O pads on one side of another die via connection paths on only a single layer is achieved. For example, routing crossing connection paths via different layers can be avoided.

Figure 7:
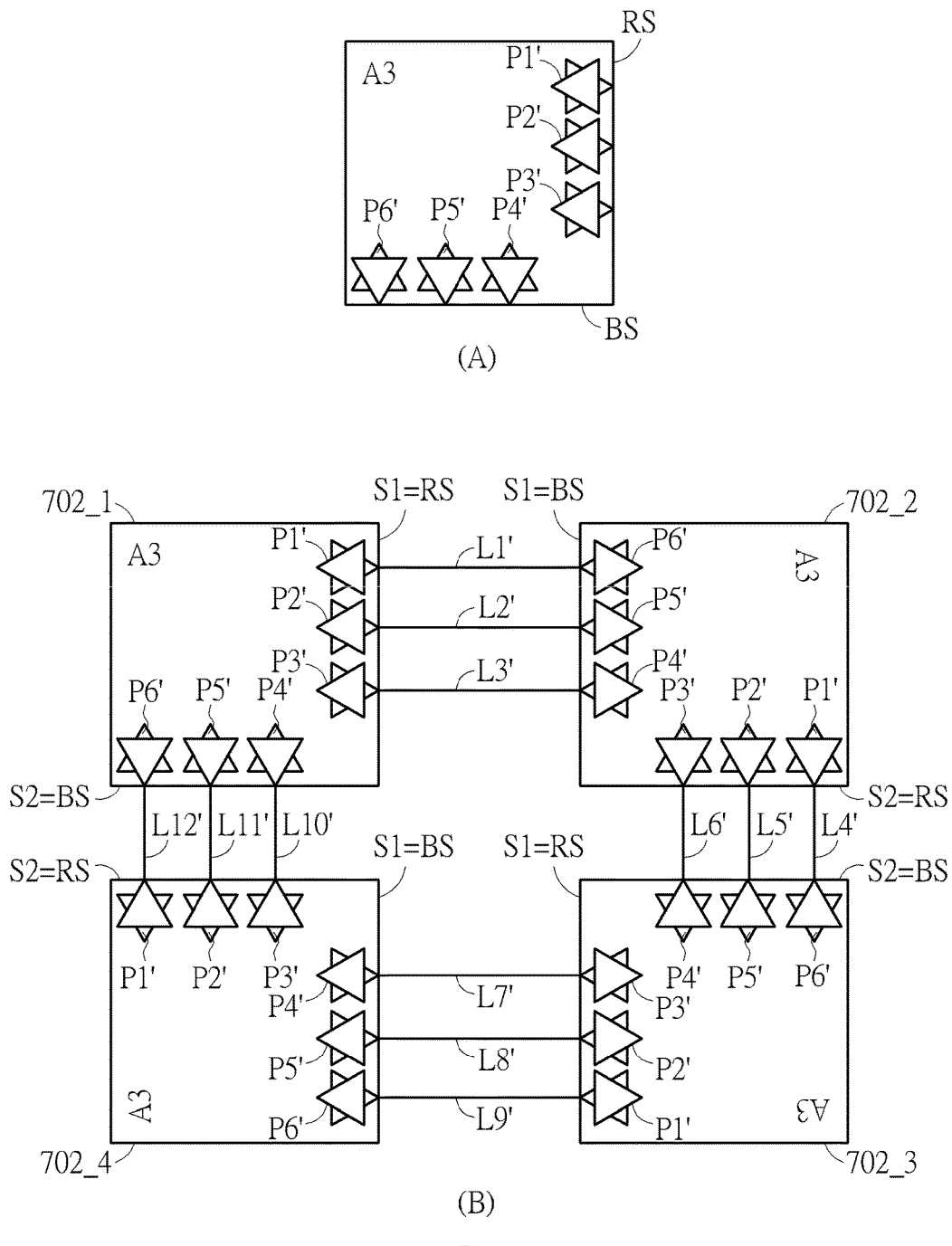
FIG. 7 is a diagram illustrating a third assembly design of homogeneous dies according to an embodiment of the present invention.

FIG. 7 is a diagram illustrating a third assembly design of homogeneous dies according to an embodiment of the present invention. The sub-diagram (A) of FIG. 7 illustrates a single die A3 having a plurality of I/O pads P1', P2', P3' on the right side RS and a plurality of I/O pads P4', P5', P6' on the bottom side BS. The I/O pads P1'-P6' are bidirectional. Hence, each of the I/O pads P1'-P6' can be configured to act as either an input pad (which is used for receiving an input signal to be processed by an input buffer (not shown) in the die A3) or an output pad (which is used for transmitting an output signal generated from an output buffer (not shown) in the die A3). The sub-diagram (B) of FIG. 7 illustrates four identical dies 702_1, 702_2, 702_3, and 702_4 connected via direct connection paths L1'-L12'. The single die A3 shown in sub-diagram (A) of FIG. 7 may be fabricated according a circuit module design mentioned above. Hence, each of the dies 702_1-702_4 is identical to the single die A3. The dies 702_1-702_4 are arranged on a wafer-level package in a side-by-side fashion. By way of example, but not limitation, the dies 702_1 and 702_2 are aligned in an X-axis direction on a plane of the wafer-level package, the dies 702_3 and 702_4 are aligned in an X-axis direction on the plane of the wafer-level package, the dies 702_1 and 702_4 are aligned in a Y-axis direction on the plane of the wafer-level package, and the dies 702_2 and 702_3 are aligned in a Y-axis direction on the plane of the wafer-level package. In this way, the symmetric placement of the dies 702_1-702_4 on the wafer-level package makes the wafer-level package have a compact size.

In addition, a first side S1 of the die 702_1 is adjacent to a first side S1 of the die 702_2, a first side S1 of the die 702_3 is adjacent to a first side S1 of the die 702_4, a second side S2 of the die 702_1 is adjacent to a second side S2 of the die 702_4, and a second side S2 of the die 702_2 is adjacent to a second side S2 of the die 702_3, where the first side S1 of the die 702_1 and the first side S1 of the die 702_2 are different sides of an identical die (i.e., right side RS and bottom side BS of single die A3), the first side S1 of the die 702_3 and the first side S1 of the die 702_4 are different sides of the identical die (i.e., right side RS and bottom side BS of single die A3), the second side S2 of the die 702_2 and the second side S2 of the die 702_3 are different sides of the identical die (i.e., right side RS and bottom side BS of single die A3), and the second side S2 of the die 702_1 and the second side S2 of the die 702_4 are different sides of the identical die (i.e., bottom side BS and right side RS of the single die A3). Hence, the orientation of the die 702_2 has a 90-degree clockwise rotation with respect to the orientation of the die 702_1, the orientation of the die 702_3 has a 90-degree rotation with respect to the orientation of the die 702_2, the orientation of the die 702_4 has a 90-degree clockwise rotation with respect to the orientation of the die 702_3, and the orientation of the die 702_1 has a 90-degree clockwise rotation with respect to the orientation of the die 702_4. Since the I/O pads P1'-P6' are bidirectional, direct connection paths L1'-L12' can be used. With the use of a bidirectional I/O design, adjacent I/O pads on one side of one die are connected to adjacent I/O pads on one side of another die via connection paths on only a single layer. For example, the connection paths between any two of the dies 702_1-702_4 have no crossing connection paths routed via different layers, which can simplify the RDL/substrate routing greatly.

In above examples shown in FIG. 6 and FIG. 7, direct connection paths can be used to connect identical dies due to a bidirectional I/O design employed by a circuit module design. Alternatively, direct connection paths can be used to connect identical dies by properly arranging the unidirectional I/O pads employed by a circuit module design.

Figure 8:
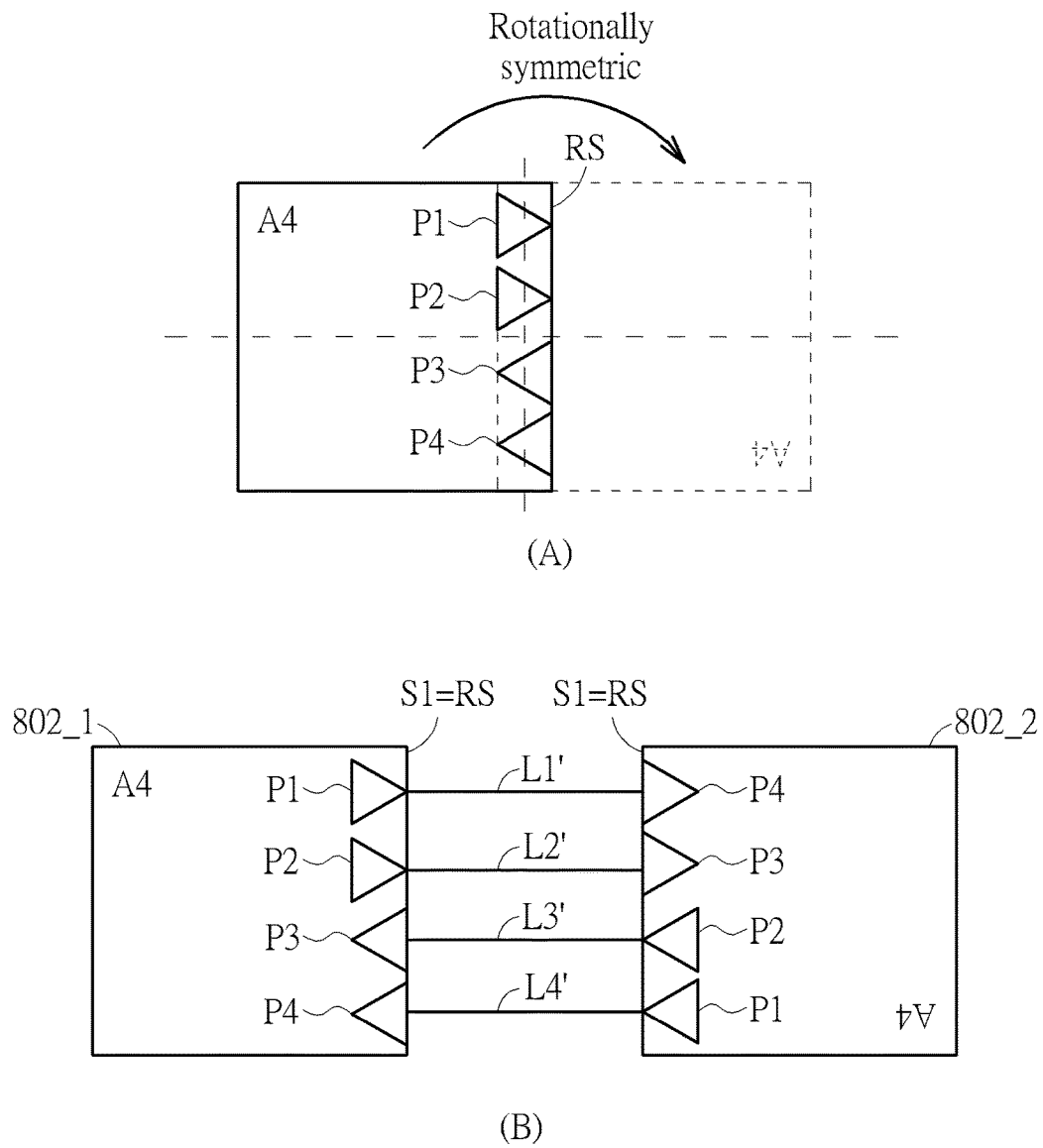
FIG. 8 is a diagram illustrating a fourth assembly design of homogeneous dies according to an embodiment of the present invention.

FIG. 8 is a diagram illustrating a fourth assembly design of homogeneous dies according to an embodiment of the present invention. The sub-diagram (A) of FIG. 8 illustrates a single die A4 having a plurality of I/O pads P1, P2, P3, P4 on the right side RS. The I/O pads P1-P4 are unidirectional. The I/O pads P1 and P2 are output pads for transmitting output signals generated from output buffers (not shown) in the die A4. The I/O pads P3 and P4 are input pads for receiving input signals to be processed by input buffers (not shown) in the die A4. In this example, the I/O pads P1-P4 on the right side RS of the die A4 are rotationally symmetric. "Rotationally symmetric" means that the I/O pads of the non-rotated die A4 exactly match the I/O pads of the die A4 rotated by a specific rotation angle (e.g., 180 degrees). As shown in the sub-diagram (A) of FIG. 8, the I/O pad P1 matches the I/O pad P4 after a 180-degree rotation, and the I/O pad P2 matches the I/O pad P3 after a 180-degree rotation. When the single die A4 has a first orientation (e.g., 0-degree rotation), I/O pads arranged on a same side of the non-rotated die A4 have a specific I/O pad definition from a top I/O pad to a bottom I/O pad. When the single die A4 has a second orientation (e.g., 180-degree rotation), the I/O pad on a same side of the rotated die A4 have the same specific I/O pad definition from a top I/O pad to a bottom I/O pad.

The sub-diagram (B) of FIG. 8 illustrates two identical dies 802_1 and 802_2 connected via direct connection paths L2', L3', L4'. For example, the dies 802_1 and 802_2 may be a master-slave pair or a peer-to-peer pair. The single die A4 shown in sub-diagram (A) of FIG. 8 may be fabricated according a circuit module design mentioned above. Hence, each of the dies 802_1 and 802_2 is identical to the single die A4. The dies 802_1 and 802_2 are arranged on a wafer-level package in a side-by-side fashion. In addition, a first side S1 of the die 802_1 is adjacent to a first side S1 of the die 802_2, where each of the first side S1 of the die 802_1 and the first side S1 of the die 802_2 is the same side of an identical die (i.e., right side RS of single die A4). Hence, the orientation of the die 802_2 has a 180-degree rotation with respect to the orientation of the die 802_1.

Since the I/O pads P1-P4 on the right side RS of the die A4 are rotationally symmetric, the I/O pad P1 of the die 802_1 is connected to the I/O pad P4 of the die 802_2 via a direct connection path L1', the I/O pad P2 of the die 802_1 is connected to the I/O pad P3 of the die 802_2 via a direct connection path L2', the I/O pad P3 of the die 802_1 is connected to the I/O pad P2 of the die 802_2 via a direct connection path L3', and the I/O pad P4 of the die 802_1 is connected to the I/O pad P1 of the die 802_2 via a direct connection path L4'. With the use of a rotationally symmetric I/O design, adjacent I/O pads on one side of one die are connected to adjacent I/O pads on one side of another die via connection paths on only a single layer. For example, the connection paths between the dies 802_1 and 802_2 have no crossing connection paths routed via different layers, which can simplify the RDL/substrate routing greatly.

The assembly example shown in FIG. 8 has only two identical dies each using a rotationally symmetric I/O design. However, this is for illustrative purposes only, and is not meant to be a limitation of the present invention. Assembling more than two identical dies each using a rotationally symmetric I/O design in a wafer-level package is feasible. Hence, different products (e.g., network switch products with different line rates) can be provided by assembling different numbers of homogeneous dies. In addition, connecting adjacent I/O pads on one side of one die to adjacent I/O pads on one side of another die via connection paths on only a single layer can be achieved. For example, routing crossing connection paths via different layers can be avoided.

Figure 9:
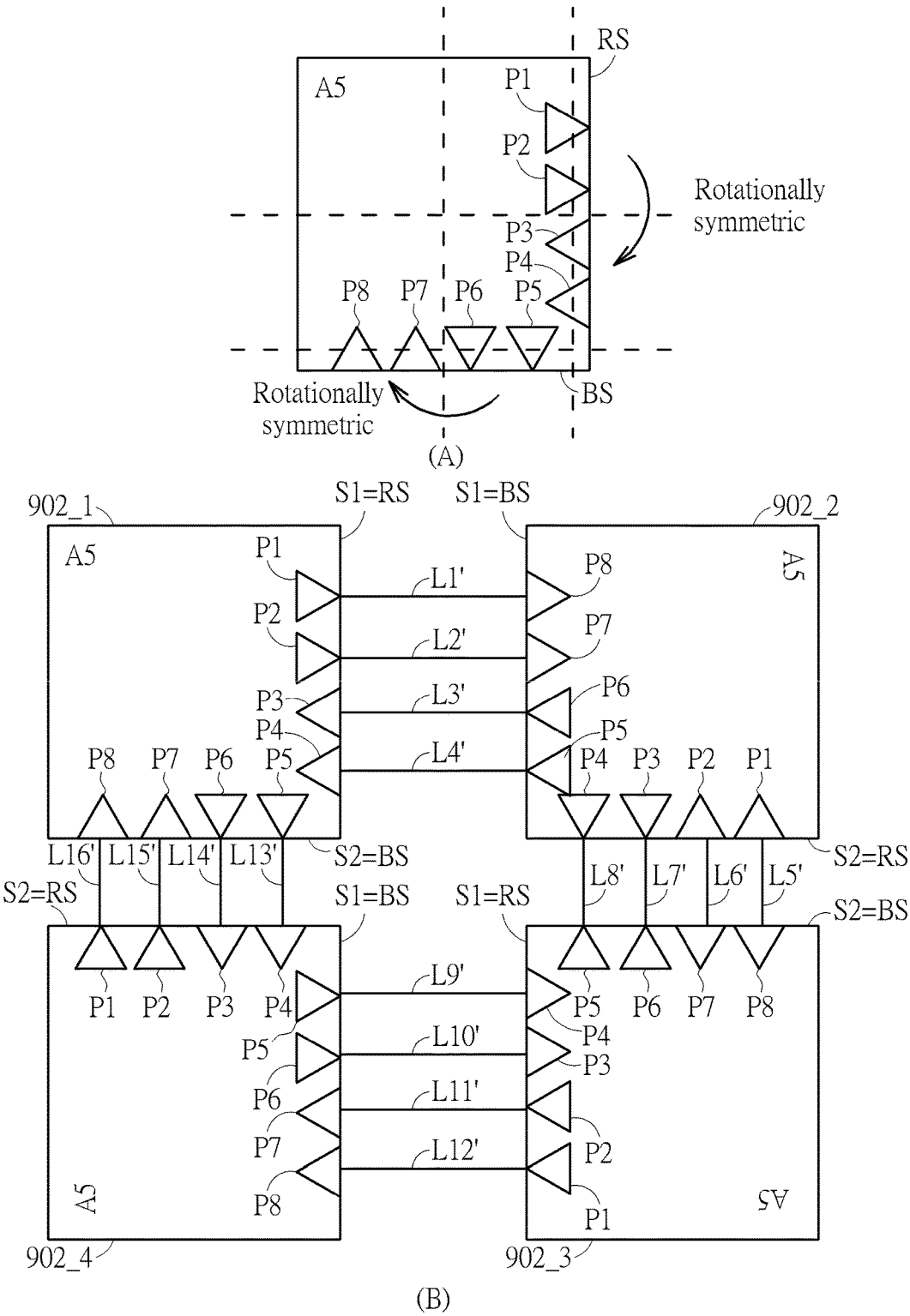
FIG. 9 is a diagram illustrating a fifth assembly design of homogeneous dies according to an embodiment of the present invention.

FIG. 9 is a diagram illustrating a fifth assembly design of homogeneous dies according to an embodiment of the present invention. The sub-diagram (A) of FIG. 9 illustrates a single die A5 having a plurality of I/O pads P1, P2, P3, P4 on the right side RS and a plurality of I/O pads P5, P6, P7, P8 on the bottom side BS. The I/O pads P1-P8 are unidirectional. The I/O pads P1, P2, P5, P6 are output pads for transmitting output signals generated from output buffers (not shown) in the die A5. The I/O pads P3, P4, P7, P8 are input pads for receiving input signals to be processed by input buffers (not shown) in the die A5. In this example, the I/O pads P1-P4 on the right side RS of the die A5 are rotationally symmetric, and the I/O pads P5-P8 on the bottom side BS are rotationally symmetric. As shown in the sub-diagram (A) of FIG. 9, the I/O pad P1 matches the I/O pad P4 after a 180-degree rotation, the I/O pad P2 matches the I/O pad P3 after a 180-degree rotation, the I/O pad P5 matches the I/O pad P8 after a 180-degree rotation, and the I/O pad P6 matches the I/O pad P7 after a 180-degree rotation. Moreover, the I/O pads P1-P4 on the right side RS are rotationally symmetric to the I/O pads P5-P8 on the bottom side BS. As shown in the sub-diagram (A) of FIG. 9, the I/O pad P1 matches the I/O pad P5 after a 90-degree rotation, the I/O pad P2 matches the I/O pad P6 after a 90-degree rotation, the I/O pad P3 matches the I/O pad P7 after a 90-degree rotation, and the I/O pad P4 matches the I/O pad P8 after a 90-degree rotation.

The sub-diagram (B) of FIG. 9 illustrates four identical dies 902_1, 902_2, 902_3, and 902_4 connected via direct connection paths L1'-L16'. The single die A5 shown in sub-diagram (A) of FIG. 9 may be fabricated according a circuit module design mentioned above. Hence, each of the dies 902_1-902_4 is identical to the single die A5. The dies 902_1-902_4 are arranged on a wafer-level package in a side-by-side fashion. Byway of example, but not limitation, the dies 902_1 and 902_2 are aligned in an X-axis direction on a plane of the wafer-level package, the dies 902_3 and 902_4 are aligned in an X-axis direction on the plane of the wafer-level package, the dies 902_1 and 902_4 are aligned in a Y-axis direction on the plane of the wafer-level package, and the dies 902_2 and 902_3 are aligned in a Y-axis direction on the plane of the wafer-level package. In this way, the symmetric placement of the dies 902_1-902_4 on the wafer-level package makes the wafer-level package have a compact size.

In addition, a first side S1 of the die 902_1 is adjacent to a first side S1 of the die 902_2, a first side S1 of the die 902_3 is adjacent to a first side S1 of the die 902_4, a second side S2 of the die 902_1 is adjacent to a second side S2 of the die 902_4, and a second side S2 of the die 902_2 is adjacent to a second side S2 of the die 902_3, where the first side S1 of the die 902_1 and the first side S1 of the die 902_2 are different sides of an identical die (i.e., right side RS and bottom side BS of single die A5), the first side S1 of the die 902_3 and the first side S1 of the die 902_4 are different sides of the identical die (i.e., right side RS and bottom side BS of single die A5), the second side S2 of the die 902_2 and the second side S2 of the die 902_3 are different sides of the identical die (i.e., right side RS and bottom side BS of single die A5), and the second side S2 of the die 902_1 and the second side S2 of the die 902_4 are different sides of the identical die (i.e., bottom side BS and right side RS of single die A5). Hence, the orientation of the die 902_2 has a 90-degree clockwise rotation with respect to the orientation of the die 902_1, the orientation of the die 902_3 has a 90-degree rotation with respect to the orientation of the die 902_2, the orientation of the die 902_4 has a 90-degree clockwise rotation with respect to the orientation of the die 902_3, and the orientation of the die 902_1 has a 90-degree clockwise rotation with respect to the orientation of the die 902_4. Since I/O pads P1-P4 arranged on the right side RS of the die A5 are rotationally symmetric, I/O pads P5-P8 arranged on the bottom side BS of the die A5 are rotationally symmetric and I/O pads P1-P4 arranged on the right side RS of the die A5 are rotationally symmetric to I/O pads P5-P8 arranged on the bottom side BS of the die A5, direct connection paths L1'-L16' can be used. With the use of a rotationally symmetric I/O design, adjacent I/O pads on one side of one die are connected to adjacent I/O pads on one side of another die via connection paths on only a single layer. For example, the connection paths between any two of the dies 902_1-902_4 have no crossing connection paths routed via different layers, which can simplify the RDL/substrate routing greatly.

In above examples shown in FIG. 8 and FIG. 9, a rotationally symmetric I/O design is employed by a circuit module design, and direct connection paths can be used to connect identical dies each having the circuit module design by arranging the side-by-side identical dies in different orientations. However, this is for illustrative purposes only, and is not meant to be a limitation of the present invention. Alternatively, direct connection paths can be used to connect the side-by-side identical dies in the same orientation by properly arranging I/O pads on opposite sides of a circuit module design.

Figure 10:
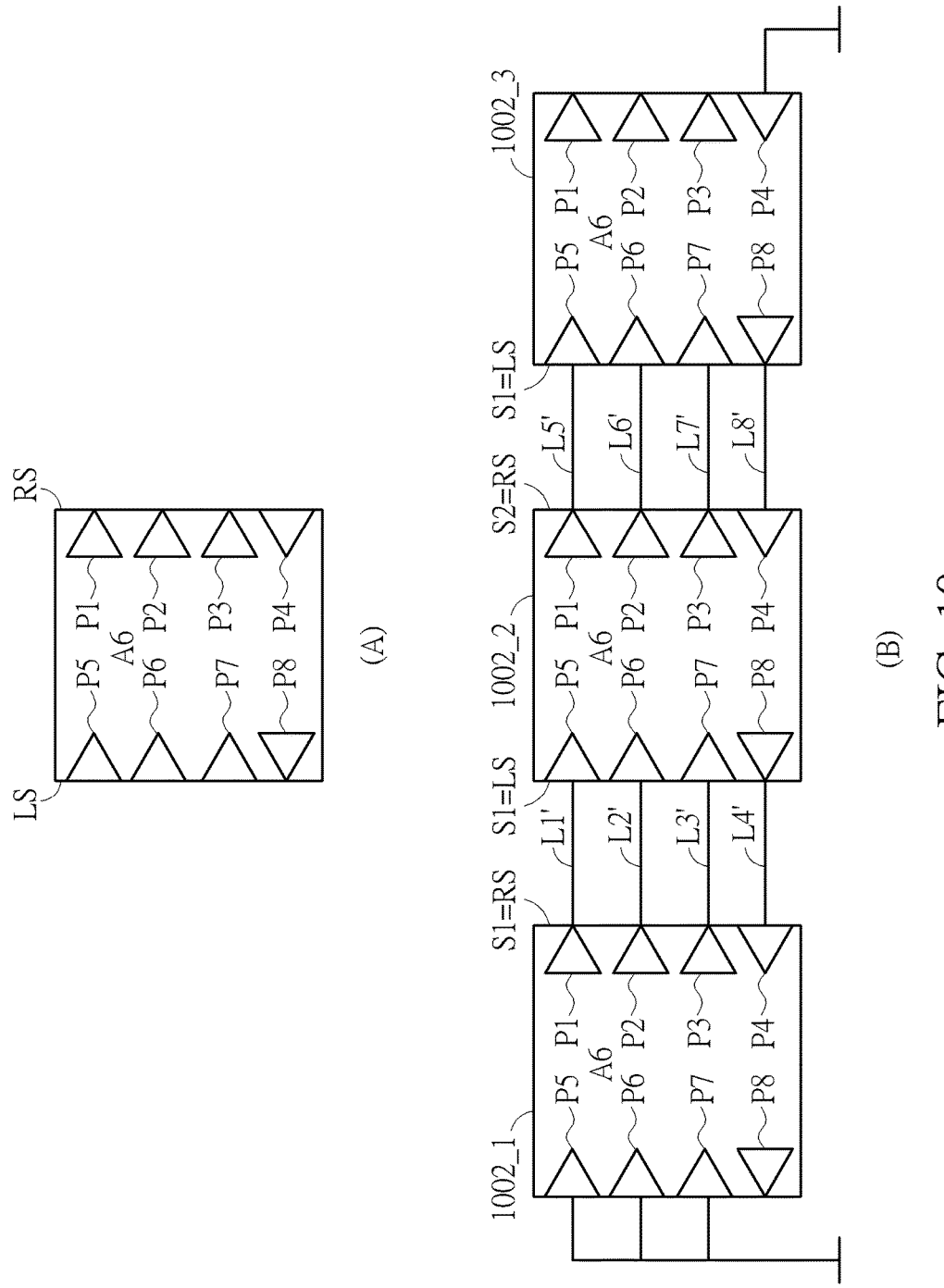
FIG. 10 is a diagram illustrating a sixth assembly design of homogeneous dies according to an embodiment of the present invention.

FIG. 10 is a diagram illustrating a sixth assembly design of homogeneous dies according to an embodiment of the present invention. The sub-diagram (A) of FIG. 10 illustrates a single die A6 having a plurality of I/O pads P1, P2, P3, P4 on the right side RS and a plurality of I/O pads P5, P6, P7, P8 on the left side LS opposite to the right side RS. The I/O pads P1-P8 are unidirectional. The I/O pads P1, P2, P3, P8 are output pads for transmitting output signals generated from output buffers (not shown) in the die A6. The I/O pads P4, P5, P6, P7 are input pads for receiving input signals to be processed by input buffers (not shown) in the die A6. In this example, the I/O pads P1 and P5 arranged on opposite sides of the die A6 form a first side-to-side transmit/receive (Tx/Rx) pair, the I/O pads P2 and P6 arranged on opposite sides of the die A6 form a second side-to-side Tx/Rx pair, the I/O pads P3 and P7 arranged on opposite sides of the die A6 form a third side-to-side Tx/Rx pair, and the I/O pads P8 and P4 arranged on opposite sides of the die A6 form a fourth side-to-side Tx/Rx pair.

The sub-diagram (B) of FIG. 10 illustrates three identical dies 1002_1, 1002_2, and 1002_3 connected via direct connection paths L1'-L8'. The single die A6 shown in sub-diagram (A) of FIG. 10 may be fabricated according a circuit module design mentioned above. Hence, each of the dies 1002_1-1002_3 is identical to the single die A6. The dies 1002_1-1002_3 are arranged on a wafer-level package in a side-by-side fashion. In addition, a first side S1 of the die 1002_2 is adjacent to a first side S1 of the die 1002_1, and a second side S2 of the die 1002_2 is adjacent to a first side S1 of the die 1002_3, where the first side S1 of the die 1002_1 and the first side S1 of the die 1002_2 are different sides of an identical die (i.e., right side RS and left side LS of single die A6), and the second side S2 of the die 1002_2 and the first side S1 of the die 1002_3 are different sides of the identical die (i.e., right side RS and left side LS of single die A6). Since I/O pads P1-P4 arranged on the right side RS of the die A6 and I/O pads P5-P8 arranged on the left side LS of the same die A6 form a plurality of side-to-side Tx/Rx pairs, direct connection paths L1'-L4' can be used between two identical dies 1002_1 and 1002_2, and direct connection paths L5'-L8' can be used between two identical dies 1002_2 and 1002_3. It should be noted that the unused I/O pads can be tied to the ground. With the use of a side-to-side Tx/Rx I/O pair design, adjacent I/O pads on one side of one die are connected to adjacent I/O pads on one side of another die via connection paths on only a single layer. For example, the connection paths between any two of the dies 1002_1-1002_3 have no crossing connection paths routed via different layers, which can simplify the RDL/substrate routing greatly.

Figure 11:
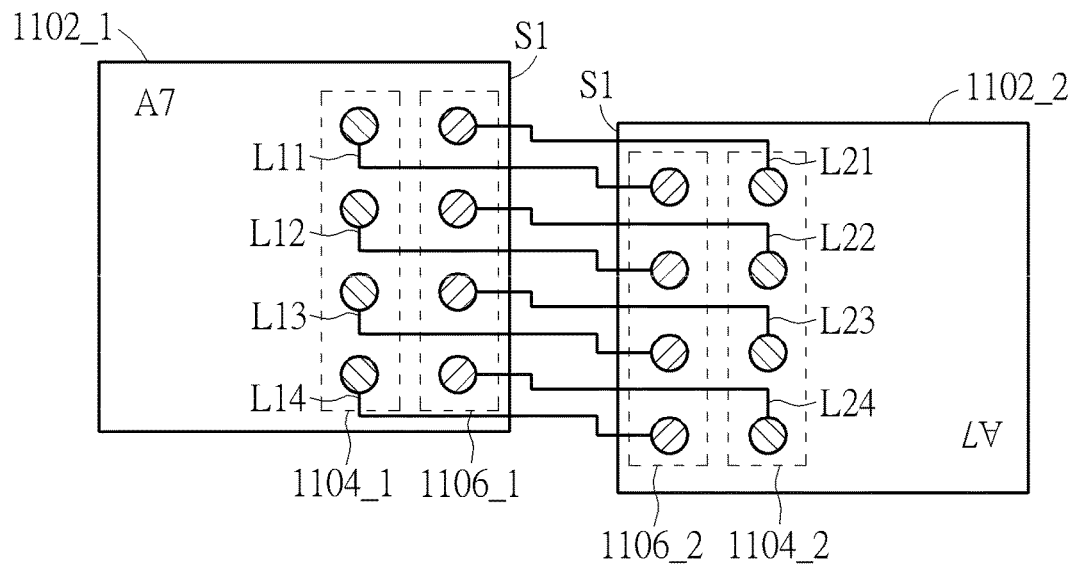
FIG. 11 is a diagram illustrating a seventh assembly design of homogeneous dies according to an embodiment of the present invention.

If I/O pads on the same side of an identical die are arranged in multiple rows, the present invention further proposes configuring the connection paths between two identical dies properly to make the difference between connection paths small. FIG. 11 is a diagram illustrating a seventh assembly design of homogeneous dies according to an embodiment of the present invention. A wafer-level package has two identical dies 1102_1 and 1102_2 arranged in a side-by-side fashion, wherein a first side S1 of the die 1102_1 is adjacent to a first side of the die 1102_2, and each of the first side S1 of the die 1102_1 and the first side S1 of the die 1102_1 is the same side of an identical die. As shown in FIG. 11, the die 1102_1 is a non-rotated version of an identical die, and the die 1102_2 is a rotated version of the identical die. In this example, a Tx/Rx multi-row I/O design is employed by each identical die. Hence, the I/O pads on the first side S1 of the die 1102_1 are arranged in multiple rows including at least an inner row 1104_1 and an outer row 1106_1, where the outer row 1106_1 is closer to an edge of the first side S1 of the die 1102_1 than the inner row 1104_1. In addition, the I/O pads on the first side S1 of the die 1102_2 are arranged in multiple rows including at least an inner row 1104_2 and an outer row 1106_2, where the outer row 1106_2 is closer to an edge of the first side S1 of the die 1102_2 than the inner row 1104_2. For example, I/O pads of the same inner row 1104_1/1104_2 are all input pads, and I/O pads of the same outer row 1106_1/1106_2 are all output pads.

For another example, I/O pads of the same inner row 1104_1/1104_2 are all output pads, and I/O pads of the same outer row 1106_1/1106_2 are all input pads. As shown in FIG. 11, first connection paths L11, L12, L13, L14 are used to connect I/O pads arranged in the inner row 1104_1 to I/O pads arranged in the outer row 1106_2, respectively; and second connection paths L21, L22, L23, L24 are used to connect I/O pads arranged in the outer row 1106_1 to I/O pads arranged in the inner row 1104_2, respectively. In this example, all of first connection paths L11-L14 and second connection paths L21-L24 are configured to have the same wire length. It should be noted that the Tx/Rx multi-row I/O design is not limited to identical dies assembled in the same wafer-level package to generate a target chip. For example, the dies 1102_1 and 1102_2 may be distinct dies in an alternative design.

Figure 12:
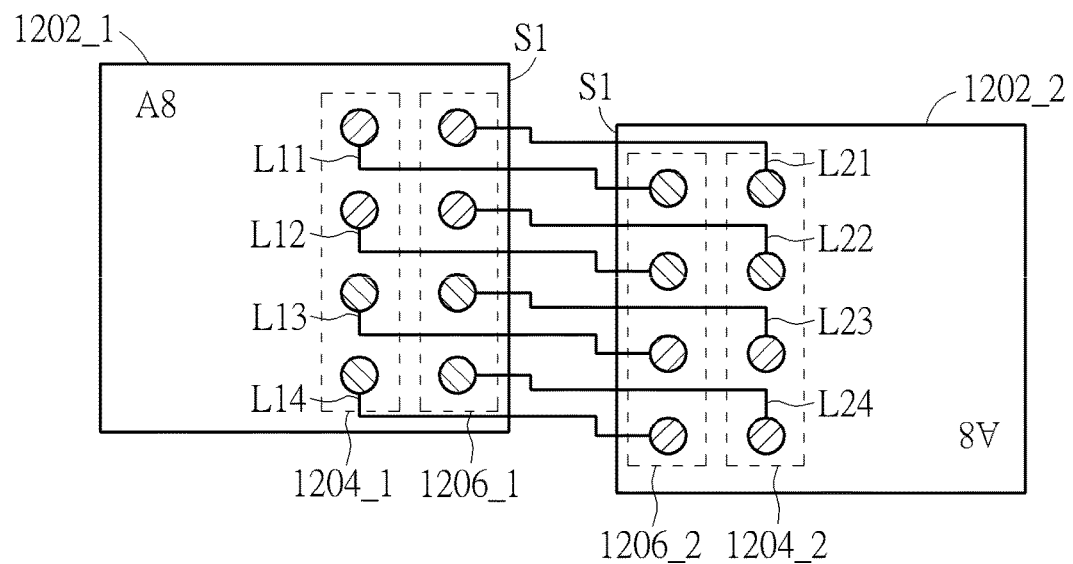
FIG. 12 is a diagram illustrating an eighth assembly design of homogeneous dies according to an embodiment of the present invention.

FIG. 12 is a diagram illustrating an eighth assembly design of homogeneous dies according to an embodiment of the present invention. A wafer-level package has two identical dies 1202_1 and 1202_2 arranged in a side-by-side fashion, wherein a first side S1 of the die 1202_1 is adjacent to a first side of the die 1202_2, and each of the first side S1 of the die 1202_1 and the first side S1 of the die 1202_1 is the same side of an identical die. As shown in FIG. 12, the die 1202_1 is a non-rotated version of an identical die, and the die 1202_2 is a rotated version of the identical die. In this example, a Tx/Rx multi-row I/O design is employed by each identical die. Hence, the I/O pads on the first side S1 of the die 1202_1 are arranged in multiple rows including at least an inner row 1204_1 and an outer row 1206_1, where the outer row 1206_1 is closer to an edge of the first side S1 of the die 1202_1 than the inner row 1204_1. The I/O pads on the first side S1 of the die 1202_2 are arranged in multiple rows including at least an inner row 1204_2 and an outer row 1206_2, where the outer row 1206_2 is closer to an edge of the first side S1 of the die 1202_2 than the inner row 1204_2. The I/O pads of the same inner row 1204_1/1204_2 include input pads and output pads, and the I/O pads of the same outer row 1206_1/1206_2 include input pads and output pads.

For example, the upper two I/O pads of the same row are input pads, and the lower two I/O pads of the same row are output pads. For another example, the upper two I/O pads of the same row are output pads, and the lower two I/O pads of the same row are input pads. As shown in FIG. 12, first connection paths L11, L12, L13, L14 are used to connect I/O pads arranged in the inner row 1204_1 to I/O pads arranged in the outer row 1206_2, respectively; and second connection paths L21, L22, L23, L24 are used to connect I/O pads arranged in the outer row 1206_1 to I/O pads arranged in the inner row 1204_2, respectively. In this example, all of first connection paths L11-L14 and second connection paths L21-L24 are configured to have the same wire length. It should be noted that the Tx/Rx multi-row I/O design is not limited to identical dies assembled in the same wafer-level package to generate a target chip. For example, the dies 1202_1 and 1202_2 may be distinct dies in an alternative design.

In above examples, multiple dies assembled in a wafer-level package are homogeneous dies (i.e., identical dies) only. However, this is for illustrative purposes only, and is not meant to be a limitation of the present invention. Alternatively, multiple dies assembled in a wafer-level package can include heterogeneous dies (i.e., distinct dies). That is, any wafer-level package using the proposed I/O pad design/arrangement (e.g., bidirectional I/O design, rotationally symmetric I/O design, or side-to-side Tx/Rx I/O pair design) to connect adjacent I/O pads on one side of one die to adjacent I/O pads on one side of another die via connection paths on only a single layer falls within the scope of the present invention. For example, any wafer-level package using the proposed I/O pad design/arrangement (e.g., bidirectional I/O design, rotationally symmetric I/O design, or side-to-side Tx/Rx I/O pair design) to avoid using crossing connection paths between side-by-side dies falls within the scope of the present invention.

Figure 13:
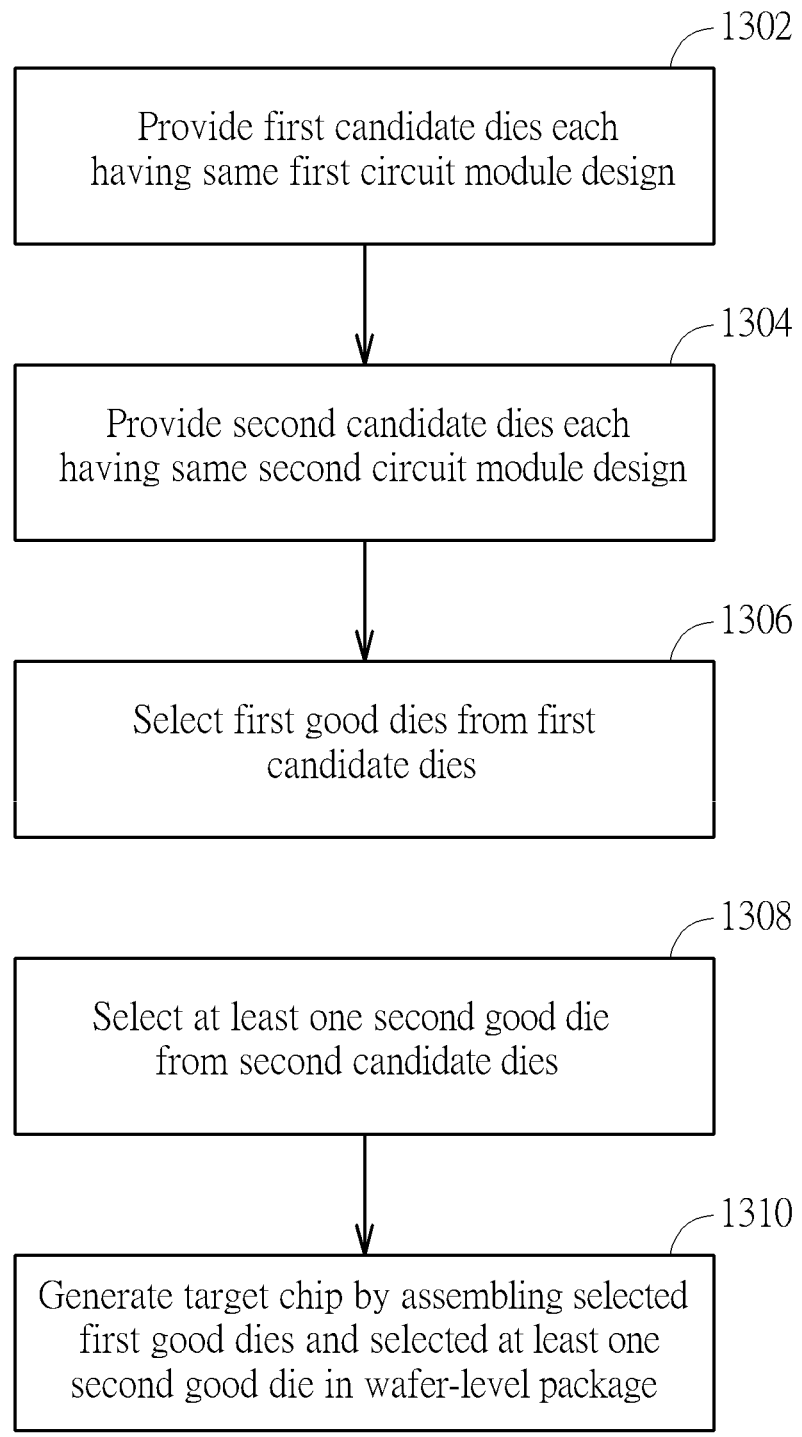
FIG. 13 is a flowchart illustrating a second yield improvement method according to an embodiment of the present invention.

The yield improvement method shown in FIG. 1 is employed to generate a target chip by assembling multiple identical dies in a same wafer-level package. However, this is for illustrative purposes only, and is not meant to be a limitation of the present invention. Alternatively, a target chip may be generated by assembling multiple dies in a same wafer-level package, where the multiple dies may have identical dies and at least one distinct die. FIG. 13 is a flowchart illustrating a second yield improvement method according to an embodiment of the present invention. Provided that the result is substantially the same, the steps are not required to be executed in the exact order shown in FIG. 13. In addition, certain steps may be added to or removed from the flow shown in FIG. 13. The exemplary yield improvement method may be briefly summarized as below.

Step 1302: Provide a plurality of first candidate dies each having the same first circuit module design.

Step 1304: Provide a plurality of second candidate dies each having the same second circuit module design, where the second circuit module is distinct from the first circuit module design. For example, a chip function of a target chip is split into first circuit designs each having the same first circuit module design and at least one second circuit design each having the same second circuit module design.

Step 1306: Select a plurality of first good dies from the first candidate dies.

Step 1308: Select at least one second good die from the second candidate dies.

Step 1310: Generate the target chip by assembling the selected first good dies and the selected at least one second good die in a wafer-level package.

By way of example, but not limitation, all of the steps 1302-1310 may be performed in the same semiconductor foundry. Since the fabrication of large-sized dies on a wafer suffers from low yield and high cost, the present invention therefore proposes splitting a chip function of a target chip into a plurality of circuit designs, including first circuit designs each having the same first circuit module design and at least one second circuit design each having the same second circuit module design.

Figure 14:
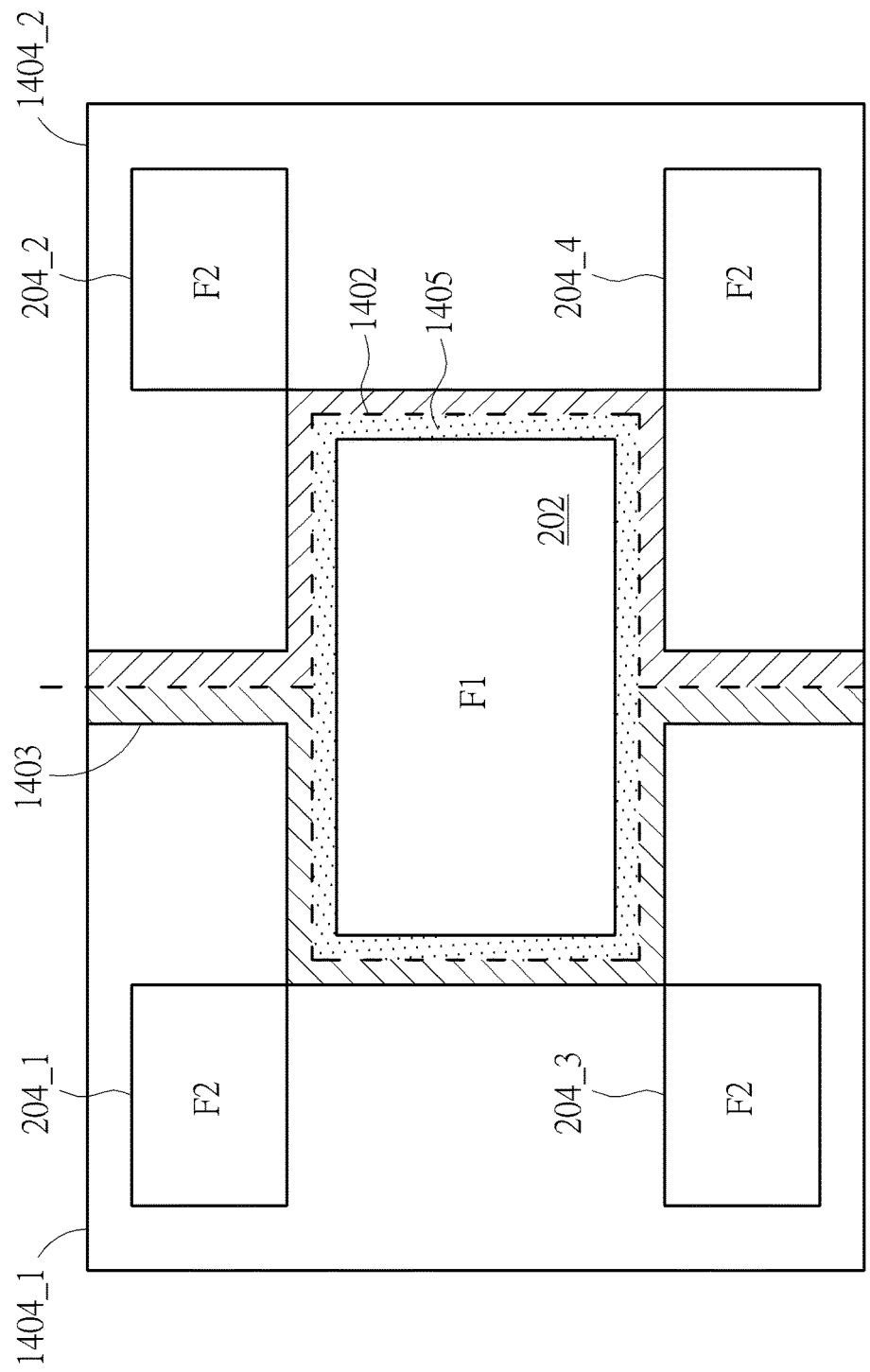
FIG. 14 is a diagram illustrating an example of splitting a chip function of a target chip into two identical circuit designs and one distinct circuit design.

Please refer to FIG. 2 in conjunction with FIG. 14. FIG. 14 is a diagram illustrating an example of splitting a chip function of a target chip into two identical circuit designs and one distinct circuit design. As shown in FIG. 14, the chip function of the target chip 200 in FIG. 2 is split into three circuit designs 1402, 1404_1 and 1404_2, where each of the circuit designs 1404_1 and 1404_2 has a first circuit module design, and the circuit design 1402 has a second circuit module design distinct from the first circuit module design. In this embodiment, the first circuit module design is designed to have two function blocks with the same function F2, and is further designed to have an extra input/output (I/O) function 1403 due to partition overhead needed for reconstructing a chip with the desired chip function in a wafer-level package; and the second circuit module design is designed to have one functional block with the function F1, and is further designed to have an extra input/output (I/O) function 1405 due to partition overhead needed for reconstructing a chip with the desired chip function in a wafer-level package. It should be noted that, if the circuit design 1404_2 is rotated by 180 degrees, the circuit design 1404_2 exactly matches the circuit design 1404_1 due to the fact that both of the circuit designs 1404_1 and 1404_2 have the same first circuit module design.

According to a circuit module design configured by splitting a chip function of a target chip, identical smaller-sized dies, each having the first circuit module design, can be fabricated on one wafer (Step 1302), and identical smaller-sized dies, each having the second circuit module design, can be fabricated on another wafer (Step 1304). Compared to a die yield of larger-sized dies each having the chip function of the chip 200, a die yield of smaller-sized dies each having the first circuit module design and a die yield of smaller-sized dies each having the second circuit module design are both higher due to reduced yield loss.

Since the desired chip function is split into multiple circuit designs, multiple dies can be combined to reconstruct the target chip with the desired chip function. In step 1306, first good dies are selected from the first candidate dies fabricated on a wafer, where the number of selected first good dies depends on the number of first circuit module designs needed to reconstruct the desired chip function. In step 1308, at least one second good die is selected from the second candidate dies fabricated on a wafer, where the number of selected second good dies depends on the number of second circuit module designs also needed to reconstruct the desired chip function. In step 1310, the selected first good dies and the selected at least one second good die are assembled in a wafer-level package to generate a target chip with the desired chip function. For example, the wafer-level package may be an integrated fan-out (InFO) package or a chip on wafer on substrate (CoWoS) package. With regard to assembling heterogeneous dies in one wafer-level package, several exemplary assembly designs are provided as below.

Figure 15:
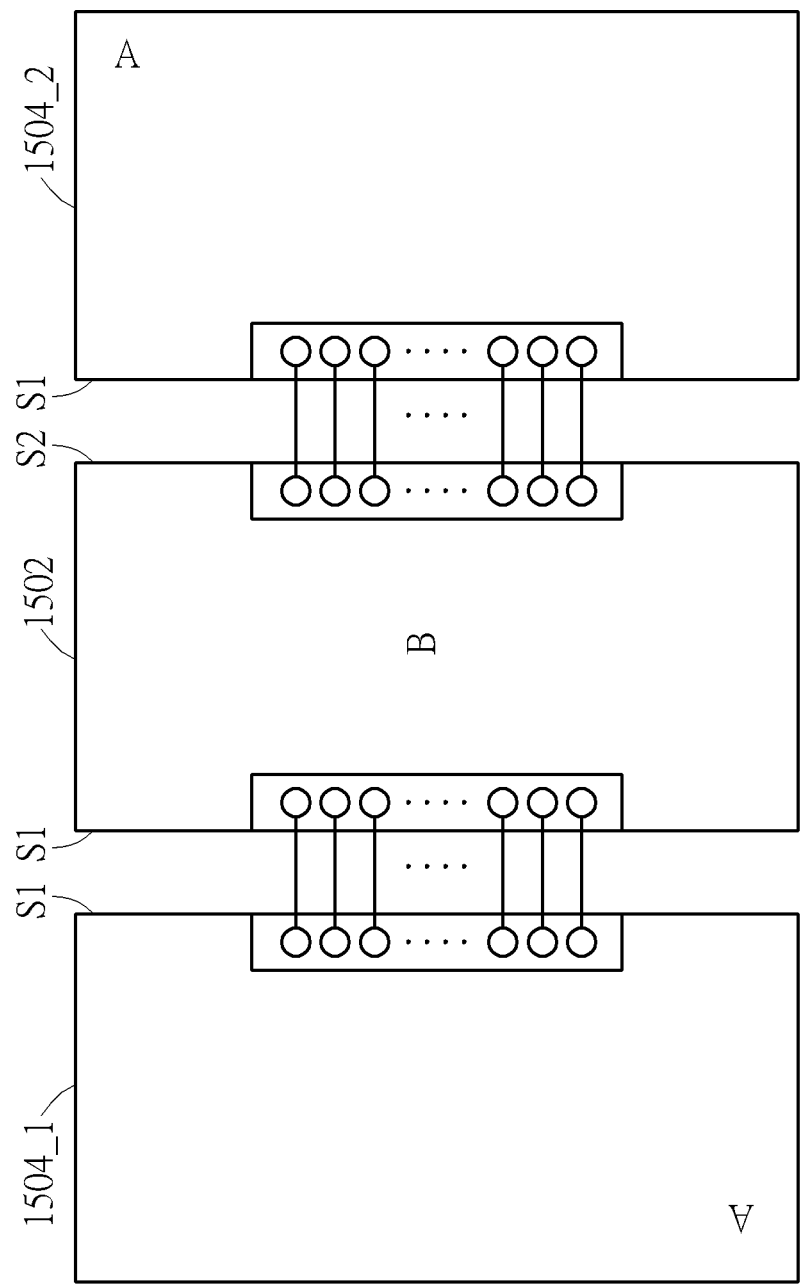
FIG. 15 is a diagram illustrating a first assembly design of heterogeneous dies according to an embodiment of the present invention.

FIG. 15 is a diagram illustrating a first assembly design of heterogeneous dies according to an embodiment of the present invention. In this example, a wafer-layer package has three dies 1502, 1504_1, and 1504_2 arranged in a side-by-side fashion, where the die 1504_1 is identical to the die 1504_2, and the die 1502 is distinct from each of the dies 1504_1 and 1504_2. For example, the die 1504_1 may be fabricated according to the second circuit module design illustrated in FIG. 14, and each of the dies 1504_1 and 1504_2 may be fabricated using the first circuit module design illustrated in FIG. 14. There are connection paths (e.g., direct connection paths) configured to connect I/O pads arranged on a first side S1 of the dies 1502 to I/O pads arranged on a first side S1 of the die 1504_1. In addition, there are connection paths (e.g., direct connection paths) configured to connect I/O pads arranged on a second side S2 of the dies 1502 to I/O pads arranged on a first side S1 of the die 1504_2. In this example, each of the first side S1 of the die 1504_1 and the first side S1 of the die 1504_2 is the same side of an identical die. Hence, the I/O pad design on the first side S1 of the die 1502 is rotationally symmetric to the I/O pad design on the second side S2 of the die 1502.

The assembly example shown in FIG. 15 has only two identical dies connected to a distinct die. However, this is for illustrative purposes only, and is not meant to be a limitation of the present invention. For example, different products (e.g., network switch products with different line rates) can be provided by different combinations of heterogeneous dies. Hence, assembling more than two identical dies and at least one distinct die in a wafer-level package is feasible.

Figure 16:
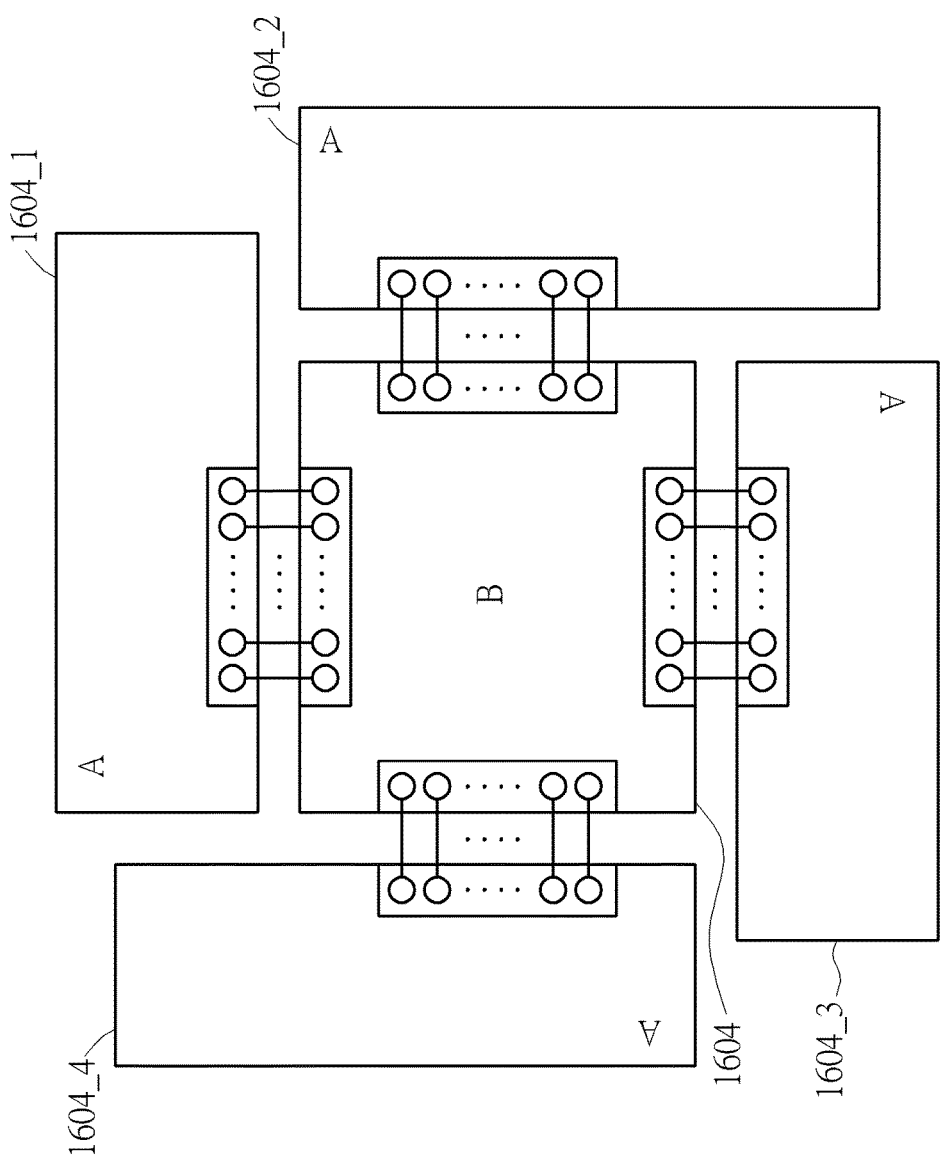
FIG. 16 is a diagram illustrating a second assembly design of heterogeneous dies according to an embodiment of the present invention.

FIG. 16 is a diagram illustrating a second assembly design of heterogeneous dies according to an embodiment of the present invention. In this example, a wafer-layer package has five dies 1602, 1604_1, 1604_2, 1604_3, 1604_4 arranged in a side-by-side fashion, where the dies 1604_1-1604_4 are identical dies, and the die 1602 is distinct from each of the dies 1604_1-1604_4. For example, the die 1604_1 may be fabricated according to the second circuit module design illustrated in FIG. 14, and each of the dies 1604_1-1604_4 may be fabricated using the first circuit module design illustrated in FIG. 14. Since more identical dies are used, a target chip generated from assembling these dies 1602 and 1604_1-1604_4 can support more processing capabilities. In other words, different products (e.g., network switch products with different line rates) can be provided by assembling different numbers of heterogeneous dies (which include identical dies and at least one distinct die).

As mentioned above, a chip function of a target chip can be split into a plurality of circuit designs. For example, each of the circuit designs may be identical to a same circuit module design. For another example, the circuit designs may include first circuit designs each having a first circuit module design and at least one second circuit design each having a second circuit module design. It is possible that certain logic in a target chip is not evenly separated into multiple identical dies. After the identical dies are assembled to generate a target chip, one of the assembled identical dies may have a logic circuit that will be enabled to achieve the chip function of the target chip, and the rest of the assembled identical dies may have duplicate(s) of the logic circuit that may be treated as redundant circuit(s).

Figure 17:
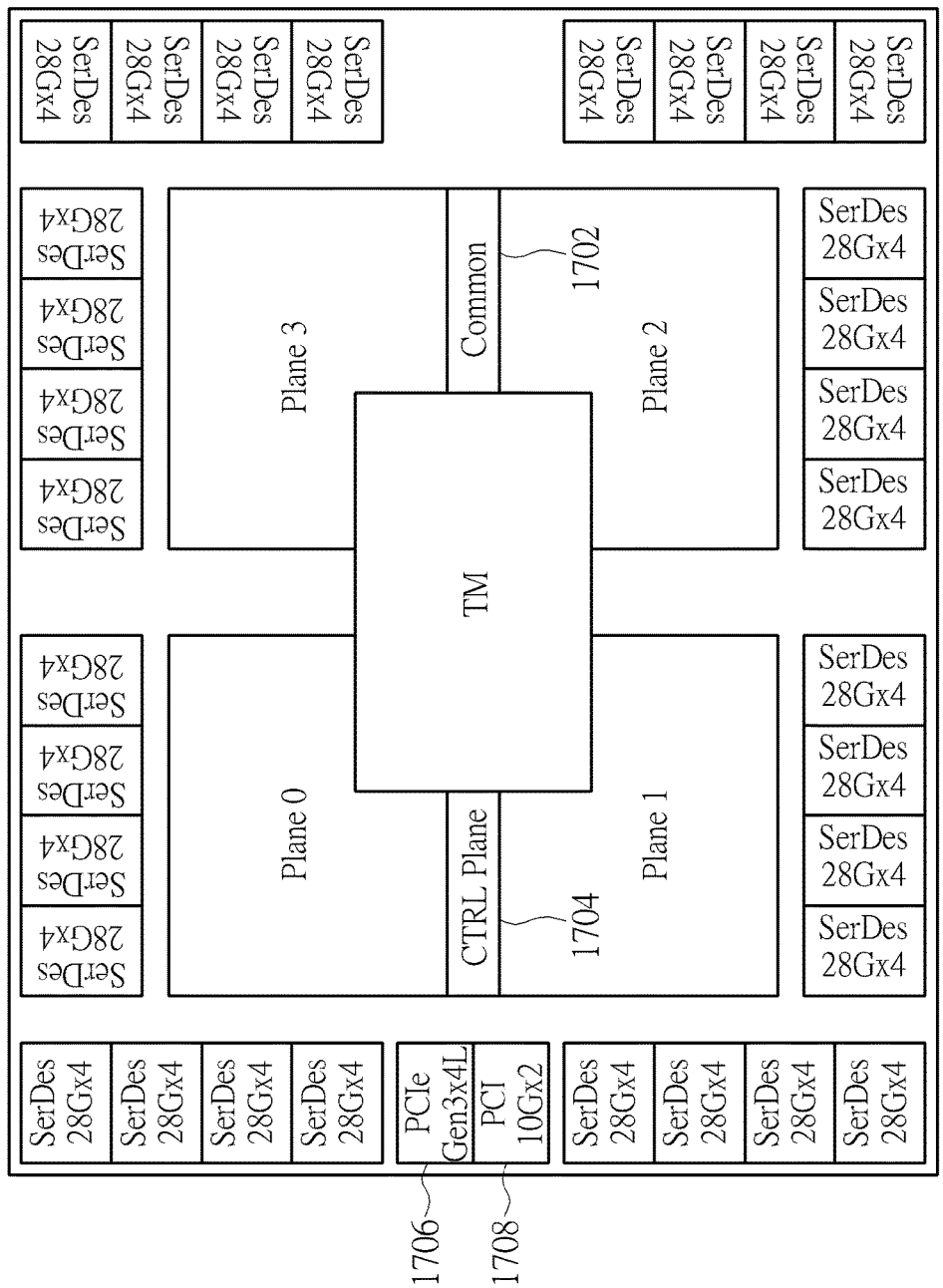
FIG. 17 is diagram illustrating a network switch realized using a single die according to an embodiment of the present invention.
Figure 18:
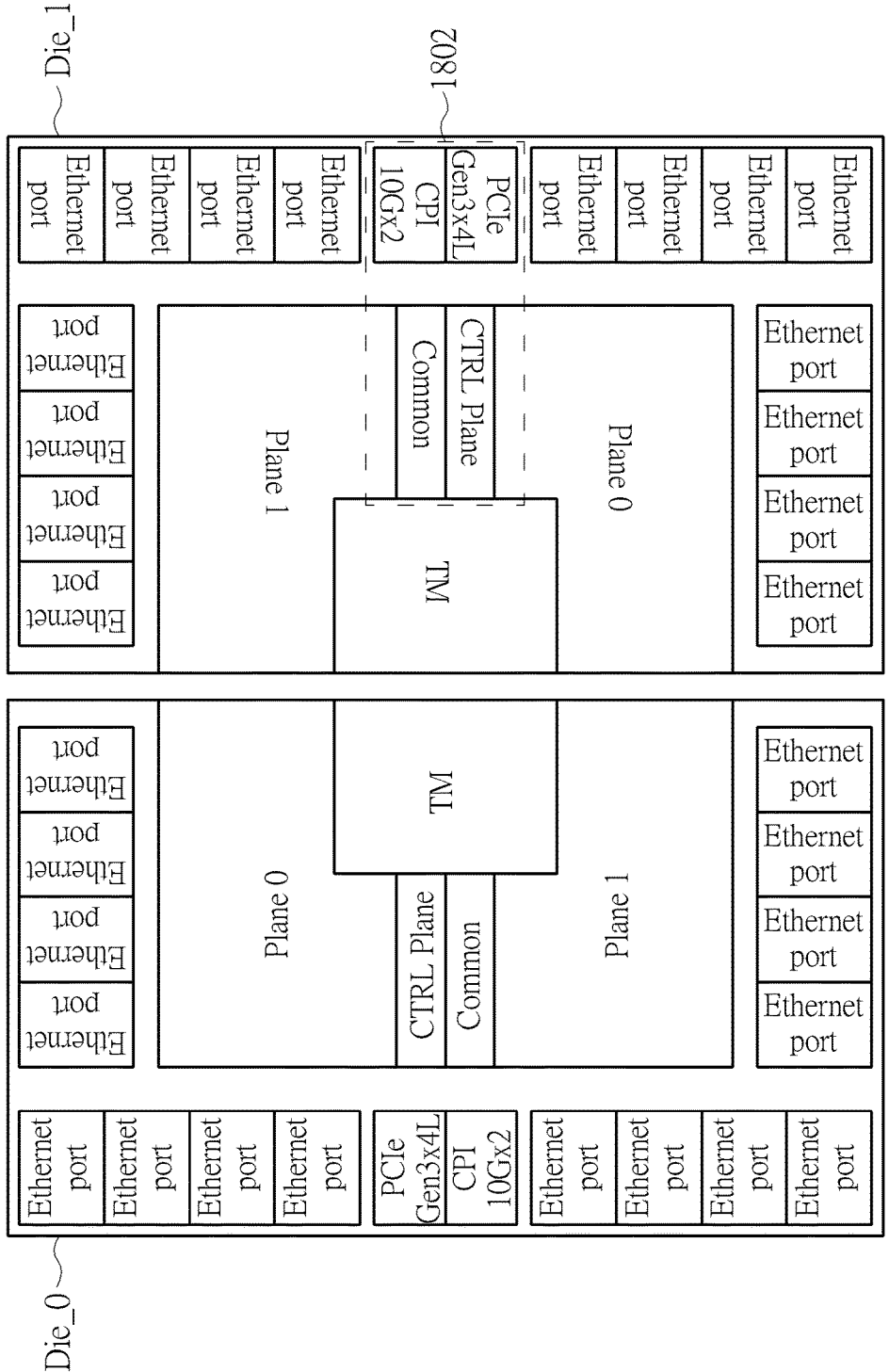
FIG. 18 is a diagram illustrating a network switch realized using two identical dies according to an embodiment of the present invention.

FIG. 17 is diagram illustrating a network switch realized using a single die according to an embodiment of the present invention. FIG. 18 is a diagram illustrating a network switch realized using two identical dies according to an embodiment of the present invention. As shown in FIG. 17, the network switch has logic circuits 1702, 1704, 1706, and 1708 that are not evenly distributed. As shown in FIG. 18, a circuit module design of an identical die encompasses these logic circuits 1702-1708. When two identical dies Die_0 and Die_1, each having the same circuit module design, are assembled in a wafer-level package, a duplicate of the logic circuits 1702-1708 in one die (e.g., Die_1) is a redundant part that will not be enabled during a normal operation of the network switch. That is, if a chip function of a target chip is not evenly split into two identical dies, at least one of the function blocks in one or more identical die is treated as a redundant block after multiple identical dies are assembled in the same wafer-level package to generate the target chip. However, if a chip function of a target chip is evenly split into two identical dies, none of the function blocks in each identical die is treated as a redundant block after two identical dies are assembled in the same wafer-level package to generate the target chip.

Figure 19:
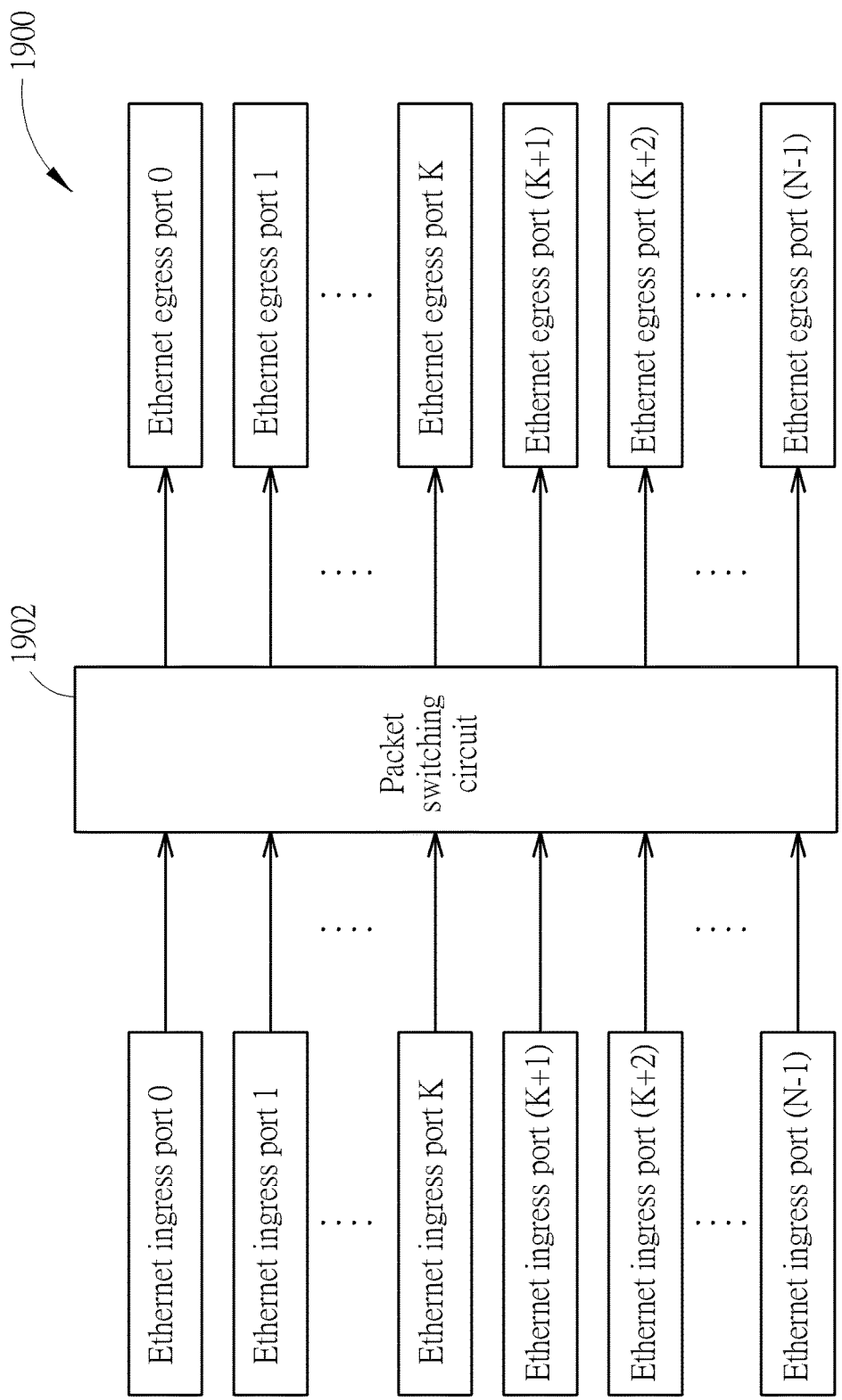
FIG. 19 is a diagram illustrating a network switch according to an embodiment of the present invention.

When a network switch chip is realized using multiple dies assembled in a wafer-level package, a larger number of cross-die signals may become a problem. FIG. 19 is a diagram illustrating a network switch according to an embodiment of the present invention. The network switch 1900 includes a packet switching circuit 1902 arranged to receive a packet received from one of N Ethernet ingress ports and forward the received packet to one of N Ethernet egress ports. As a result, the packet switching circuit 1902 needs a complicated switch fabric. If the packet switching function of the packet switching circuit 1902 is split into multiple dies, a large number of connection paths between any two dies assembled in a wafer-level package is needed.

Figure 20:
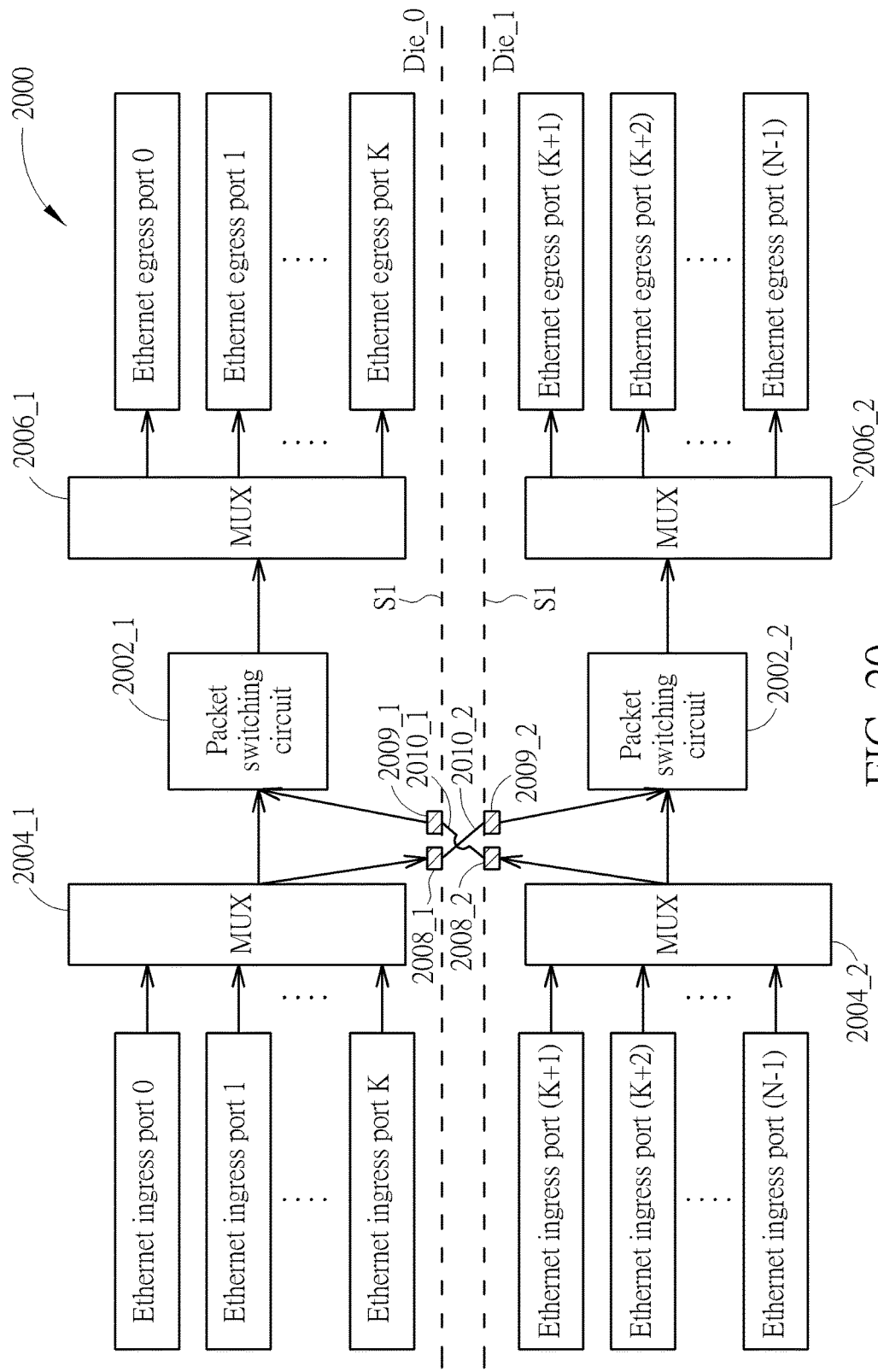
FIG. 20 is a diagram illustrating another network switch according to an embodiment of the present invention.

To simply the switch fabric of a packet switching circuit, a time-division multiplexing (TDM) technique may be employed by a network switch to transmit and receive independent signals over a common signal path. FIG. 20 is a diagram illustrating another network switch according to an embodiment of the present invention. For clarity and simplicity, it is assumed that the N Ethernet ingress ports are divided into two groups, and the N Ethernet egress ports are also divided into two groups. The network switch 2000 includes two packet switching circuits 2002_1 and 2002_2, two ingress packet multiplexers 2004_1 and 2004_2, and two egress packet multiplexers 2006_1 and 2006_2. The ingress packet multiplexer 2004_1 is arranged to receive a packet received from one of Ethernet ingress port 0 to Ethernet ingress port K, and forward the received packet to one of the packet switching circuits 2002_1 and 2002_2. For example, if a packet forwarding decision indicates that the received packet is required to be forwarded to one of Ethernet egress port 0 to Ethernet egress port K, the ingress packet multiplexer 2004_1 outputs the received packet to the packet switching circuit 2002_1. Next, the packet switching circuit 2002_1 forwards the received packet to one of Ethernet egress port 0 to Ethernet egress port K via the egress packet multiplexer 2006_1. For another example, if a packet forwarding decision indicates that the received packet is required to be forwarded to one of Ethernet egress port (K+1) to Ethernet egress port (N−1), the ingress packet multiplexer 2004_1 outputs the received packet to the packet switching circuit 2002_2. Next, the packet switching circuit 2002_2 forwards the received packet to one of Ethernet egress port (K+1) to Ethernet egress port (N−1) via the egress packet multiplexer 2006_2. Since the operation of the ingress packet multiplexer 2004_2 is similar to that of the ingress packet multiplexer 2004_1, further description is omitted here for brevity.

The ingress packet multiplexers 2004_1, 2004_2 and egress packet multiplexers 2006_1, 2006_2 are used to support a TDM feature which transmits and receives independent signals over a common signal path. As shown in FIG. 20, the ingress packet multiplexer 2004_1 receives ingress packets from Ethernet ingress port 0 to Ethernet ingress port K, and communicates with any of the packet switching circuits 2002_1 and 2002_2 via a single signal path; and the ingress packet multiplexer 2004_2 receives ingress packets from Ethernet ingress port (K+1) to Ethernet ingress port (N−1), and communicates with any of the packet switching circuits 2002_1 and 2002_2 via a single signal path. Moreover, the egress packet multiplexer 2006_1 transmits egress packets to Ethernet egress port 0 to Ethernet egress port K, and communicates with the packet switching circuit 2002_1 via a single signal path; and the egress packet multiplexer 2006_2 transmits egress packets to Ethernet ingress port (K+1) to Ethernet ingress port (N−1), and communicates with the packet switching circuit 2002_2 via a single signal path.

The chip function of the network switch 2000 can be split into two dies as illustrated by the broken lines shown in FIG. 20. The first die Die_0 and the second die Die_1 may be arranged in a side-by-side fashion, where a first side S1 of the first die Die_0 is adjacent to a first side S1 of the second die Die_1. Since the TDM technique is implemented in each of the first die Die_0 and the second die Die_1, the number of cross-die signals can be significantly reduced. In this example, the I/O pads arranged on the first side S1 of the first die Die_0 have an output pad 2008_1 for transmitting an output of the ingress packet multiplexer 2004_1, and further have an input pad 2009_1 for receiving an output of the ingress packet multiplexer 2004_2 and transmitting the output of the ingress packet multiplexer 2004_2 to the packet switching circuit 2002_1. In addition, the I/O pads arranged on the first side S1 of the second die Die_1 have an output pad 2008_2 for transmitting the output of the ingress packet multiplexer 2004_2, and further have an input pad 2009_2 for receiving the output of the ingress packet multiplexer 2004_1 and transmitting the output of the ingress packet multiplexer 2004_1 to the packet switching circuit 2002_2. As shown in FIG. 20, two connection paths 2010_1 and 2010_2 are needed for packet transaction between two dies Die_0 and Die_1.

In this example shown in FIG. 20, the chip function of the network switch 2000 is split into two dies. However, this is for illustrative purposes only, and is not meant to be a limitation of the present invention. In an alternative design, splitting the chip function of the network switch 2000 into more than two dies is feasible. For example, N Ethernet ingress ports can be divided into M groups, and N Ethernet egress ports can be divided into M groups, where M is an integer larger than 2. In addition, M ingress packet multiplexers, M packet switching circuits, and M egress packet multiplexers are used. Hence, the chip function of the network switch 2000 can be split into M dies each having one ingress packet multiplexer, one packet switching circuit and one egress packet multiplexer. It should be noted that the same objective of reducing the number of cross-die signals is achieved due to the M ingress packet multiplexers preceding the M packet switching circuits.

Figure 21:
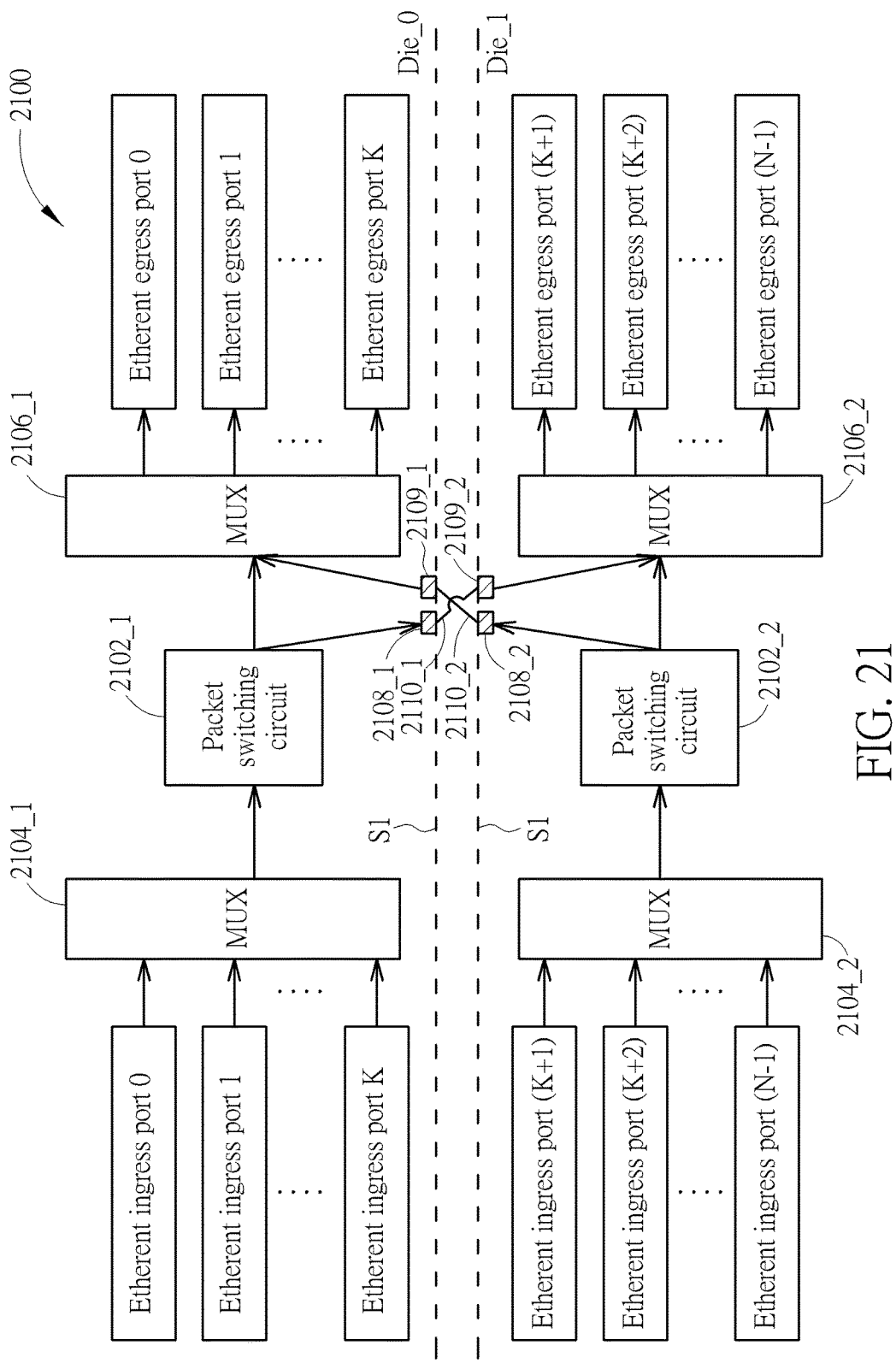
FIG. 21 is a diagram illustrating yet another network switch according to an embodiment of the present invention.

FIG. 21 is a diagram illustrating yet another network switch according to an embodiment of the present invention. For clarity and simplicity, it is assumed that the N Ethernet ingress ports are divided into two groups, and the N Ethernet egress ports are divided into two groups. The network switch 2100 includes two packet switching circuits 2102_1 and 2102_2, two ingress packet multiplexers 2104_1 and 2104_2, and two egress packet multiplexers 2106_1 and 2106_2. The ingress packet multiplexer 2104_1 is arranged to receive a packet received from one of Ethernet ingress port 0 to Ethernet ingress port K, and outputs the received packet to the packet switching circuit 2102_1. If a packet forwarding decision indicates that the received packet is required to be forwarded to one of Ethernet egress port 0 to Ethernet egress port K, the packet switching circuit 2102_1 outputs the received packet to the egress packet multiplexer 2106_1, and the received packet is forwarded to a target Ethernet egress port via the egress packet multiplexer 2106_1. If a packet forwarding decision indicates that the received packet is required to be forwarded to one of Ethernet egress port (K+1) to Ethernet egress port (N−1), the packet switching circuit 2102_1 outputs the received packet to the egress packet multiplexer 2106_2, and the received packet is forwarded to a target Ethernet egress port via the egress packet multiplexer 2106_2. Since the operation of the packet switching circuit 2102_2 is similar to that of the packet switching circuit 2102_2, further description is omitted for brevity.

The ingress packet multiplexers 2004_1, 2004_2 and egress packet multiplexers 2006_1, 2006_2 are used to support a TDM feature which transmits and receives independent signals over a common signal path. As shown in FIG. 21, the ingress packet multiplexer 2104_1 receives ingress packets from Ethernet ingress port 0 to Ethernet ingress port K, and communicates with the packet switching circuit 2102_1 via a single signal path; and the ingress packet multiplexer 2104_2 receives ingress packets from Ethernet ingress port (K+1) to Ethernet ingress port (N−1), and communicates with the packet switching circuit 2102_2 via a single signal path. Moreover, the egress packet multiplexer 2106_1 transmits egress packets to Ethernet egress port 0 to Ethernet egress port K, and communicates with any of the packet switching circuits 2102_1 and 2102_2 via a single signal path; and the egress packet multiplexer 2106_2 transmits egress packets to Ethernet ingress port (K+1) to Ethernet ingress port (N−1), and communicates with any of the packet switching circuits 2102_1 and 2102_2 via a single signal path.

The chip function of the network switch 2100 can be split into two dies as illustrated by the broken lines shown in FIG. 21. The first die Die_0 and the second die Die_1 may be arranged in a side-by-side fashion, where a first side S1 of the first die Die_0 is adjacent to a first side S1 of the second die Die_1. Since the TDM technique is implemented in each of the first die Die_0 and the second die Die_1, the number of cross-die signals can be significantly reduced. In this example, the I/O pads arranged on the first side S1 of the first die Die_0 have an output pad 2108_1 for transmitting an output of the packet switching circuit 2102_1, and further have an input pad 2109_1 for receiving an output of the packet switching circuit 2102_2 and transmitting the output of the packet switching circuit 2102_2 to the egress packet multiplexer 2106_1. In addition, the I/O pads arranged on the first side S1 of the second die Die_1 have an output pad 2108_2 for transmitting the output of the packet switching circuit 2102_2, and further have an input pad 2109_2 for receiving the output of the packet switching circuit 2102_1 and transmitting the output of the packet switching circuit 2102_1 to the egress packet multiplexer 2106_2. As shown in FIG. 21, two connection paths 2110_1 and 2110_2 are needed for packet transaction between two dies Die_0 and Die_1.

In this example shown in FIG. 21, the chip function of the network switch 2100 is split into two dies. However, this is for illustrative purposes only, and is not meant to be a limitation of the present invention. In an alternative design, splitting the chip function of the network switch 2100 into more than two dies is feasible. For example, N Ethernet ingress ports can be divided into M groups, and N Ethernet egress ports can be divided into M groups, where M is an integer larger than 2. In addition, M ingress packet multiplexers, M packet switching circuits, and M egress packet multiplexers are used. Hence, the chip function of the network switch 2100 can be split into M dies each having one ingress packet multiplexer, one packet switching circuit and one egress packet multiplexer. It should be noted that the same objective of reducing the number of cross-die signals is achieved due to the M egress packet multiplexers following the M packet switching circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer-level package comprising:
   a first die including a first set of input/output (I/O) pads having at least one I/O pad arranged on a first side of the first die;
   a second die including a second set of I/O pads having at least one I/O pad arranged on a first side of the second die, wherein the second die is identical to the first die such that the first set of I/O pads arranged on the first side of the first die correspond to the second set of I/O pads arranged on the first side of the second die, respectively;
   wherein the I/O pads are rotationally symmetric, such that the first set of I/O pads on the first side of the first die is configured to transmit signals to the second set of I/O pads on the first side of the second die, and a second set of I/O pads on the first side of the first die is configured to receive signals from a first set of I/O pads on the first side of the second die,
   wherein the first die is arranged adjacent to the second die in a side-by-side fashion on a substrate within a plane that is parallel to a surface of the substrate such that the first side of the first die is opposed to the first side of the second die; and
   a plurality of non-crossing connection paths within a single layer are configured to connect the I/O pads between the first die and the second die.

2. The wafer-level package of claim 1, wherein the first set of I/O pads on the first side of the first die includes a first subset of I/O pads, wherein at least one I/O pad of the first subset is disposed between at least two I/O pads of at least one another subset, such that the at least one I/O pad of the first subset is disposed so as not to be directly adjacent to other I/O pads of the first subset.

3. The wafer-level package of claim 1, wherein the second set of I/O pads on the first side of the first die includes a second subset of I/O pads, wherein at least one I/O pad of the second subset is disposed between at least two I/O pads of at least one another subset, such that the at least one I/O pad of the second subset is disposed so as not to be directly adjacent to other I/O pads of the second subset.

4. The wafer-level package of claim 1, wherein the first set of I/O pads on the first side of the first die are arranged so as not to be directly opposite to the second set of I/O pads on the first side of the second die, and the second set of I/O pads on the first side of the first die are arranged so as not to be directly opposite to the first set of I/O pads on the first side of the second die.

5. The wafer-level package of claim 1, wherein the first set of I/O pads on the first side of the first die are arranged so as to be directly opposite to and facing the second set of I/O pads on the first side of the second die, and the second set of I/O pads on the first side of the first die are arranged so as to be directly opposite to and facing the first set of I/O pads on the first side of the second die.

6. The wafer-level package of claim 1, wherein the I/O pads of the first set of I/O pads are not directly adjacent to each other, and the I/O pads of the second set of I/O pads are not directly adjacent to each other.

\* \* \* \* \*

UNITED STATES PATENT AND TRADEMARK OFFICE
CERTIFICATE OF CORRECTION

PATENT NO. : 10,515,939 B2  
APPLICATION NO. : 15/015110  
DATED : December 24, 2019  
INVENTOR(S) : Yi-Hung Chen et al.

Page 1 of 2

It is certified that error appears in the above-identified patent and that said Letters Patent is hereby corrected as shown below:

On the Title Page

In Column 2, item (56), Other Publications, Line 1, delete "Yu-Hung" and insert -- Yi-Hung --, In Column 2, item (56), Other Publications, Line 1, delete "Wafter-Level" and insert
-- Wafer-Level --, In the Drawings In sheet 21 of 21, FIG. 21, Line 1 (under reference numeral 2104_1), delete "Etherent" and insert
-- Ethernet --, In sheet 21 of 21, FIG. 21, Line 2 (under reference numeral 2104_1), delete "Etherent" and insert
-- Ethernet --, In sheet 21 of 21, FIG. 21, Line 4 (approx.) (under reference numeral 2104_1), delete "Etherent" and
insert -- Ethernet --, In sheet 21 of 21, FIG. 21, Line 7 (approx.) (under reference numeral 2104_1), delete "Etherent" and
insert -- Ethernet --, In sheet 21 of 21, FIG. 21, Line 8 (approx.) (under reference numeral 2104_1), delete "Etherent" and
insert -- Ethernet --, In sheet 21 of 21, FIG. 21, Line 10 (approx.) (under reference numeral 2104_1), delete "Etherent" and
insert -- Ethernet --, In sheet 21 of 21, FIG. 21, Line 1 (under reference numeral 2100), delete "Etherent" and insert
-- Ethernet --, Signed and Sealed this  
Second Day of June, 2020

Andrei Iancu  
*Director of the United States Patent and Trademark Office*

CERTIFICATE OF CORRECTION (continued)
U.S. Pat. No. 10,515,939 B2

In sheet 21 of 21, FIG. 21, Line 2 (under reference numeral 2100), delete "Etherent" and insert -- Ethernet --, In sheet 21 of 21, FIG. 21, Line 4 (approx.) (under reference numeral 2100), delete "Etherent" and insert -- Ethernet --, In sheet 21 of 21, FIG. 21, Line 7 (approx.) (under reference numeral 2100), delete "Etherent" and insert -- Ethernet --, In sheet 21 of 21, FIG. 21, Line 8 (approx.) (under reference numeral 2100), delete "Etherent" and insert -- Ethernet --, In sheet 21 of 21, FIG. 21, Line 10 (approx.) (under reference numeral 2100), delete "Etherent" and insert -- Ethernet --.